(12) United States Patent
Huang et al.

(10) Patent No.: US 11,428,879 B2
(45) Date of Patent: Aug. 30, 2022

(54) METHOD FOR FORMING A PACKAGE STRUCTURE FOR OPTICAL FIBER

(71) Applicant: Taiwan Semiconductor Manufacturing Company, Ltd., Hsinchu (TW)

(72) Inventors: Sung-Hui Huang, Dongshan Township, Yilan County (TW); Jui-Hsieh Lai, Taoyuan County (TW); Shang-Yun Hou, Jubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/197,788

(22) Filed: Mar. 10, 2021

(65) Prior Publication Data

US 2021/0215894 A1 Jul. 15, 2021

Related U.S. Application Data

(60) Continuation of application No. 16/874,219, filed on May 14, 2020, now Pat. No. 10,948,668, which is a division of application No. 16/230,652, filed on Dec. 21, 2018, now Pat. No. 10,656,351.

(60) Provisional application No. 62/752,683, filed on Oct. 30, 2018.

(51) Int. Cl.
G02B 6/42 (2006.01)
H01L 25/16 (2006.01)

(52) U.S. Cl.
CPC .......... *G02B 6/4214* (2013.01); *H01L 25/167* (2013.01)

(58) Field of Classification Search
None
See application file for complete search history.

(56) References Cited

U.S. PATENT DOCUMENTS

| | | | |
|---|---|---|---|
| 6,690,845 B1 | 2/2004 | Yoshimura et al. | |
| 7,352,066 B2 | 4/2008 | Budd | |
| 8,993,380 B2 | 3/2015 | Hou et al. | |
| 9,281,254 B2 | 3/2016 | Yu et al. | |
| 9,299,649 B2 | 3/2016 | Chiu | |
| 9,372,206 B2 | 6/2016 | Wu et al. | |
| 9,425,126 B2 | 8/2016 | Kuo | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen | |
| 9,735,131 B2 | 8/2017 | Su et al. | |
| 2003/0113067 A1* | 6/2003 | Koh | G02B 6/3596 385/24 |
| 2004/0017962 A1* | 1/2004 | Lee | G02B 6/4245 385/28 |
| 2004/0264837 A1* | 12/2004 | Ogawa | H05K 3/4694 385/14 |

(Continued)

*Primary Examiner* — Jerry Rahll
(74) *Attorney, Agent, or Firm* — Birch, Stewart, Kolasch & Birch, LLP

(57) ABSTRACT

A method for forming a package structure is provided. The method includes disposing an optical component and a waveguide over a substrate, forming a passivation layer over the substrate and covering the optical component and the waveguide, and forming a reflector including a metal layer and a first semiconductor layer on the passivation layer, wherein the metal layer and the first semiconductor layer are in contact with the passivation layer.

20 Claims, 20 Drawing Sheets

(56) References Cited

U.S. PATENT DOCUMENTS

| | | |
|---|---|---|
| 2005/0180698 A1 | 8/2005 | Hauffe et al. |
| 2009/0245720 A1 | 10/2009 | Choki et al. |
| 2013/0209026 A1 | 8/2013 | Doany et al. |
| 2016/0238801 A1* | 8/2016 | Lee .................. G02B 6/136 |
| 2020/0132949 A1* | 4/2020 | Huang ............... G02B 6/428 |

* cited by examiner

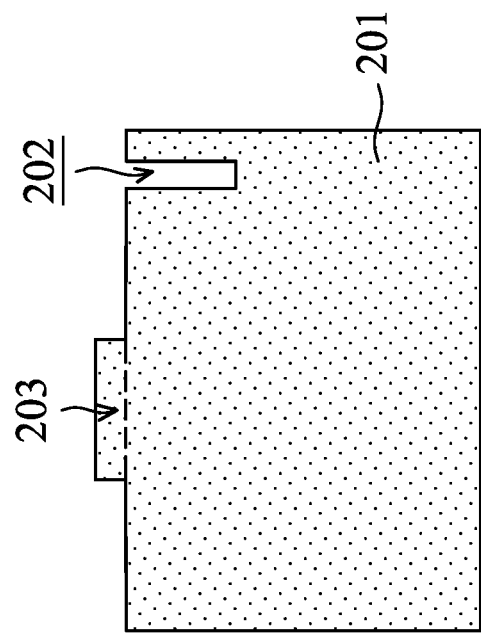
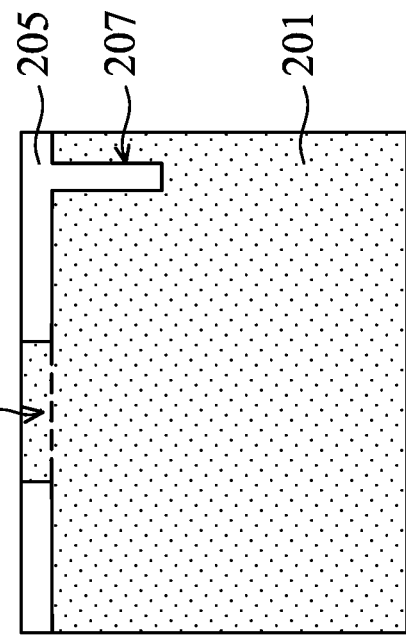
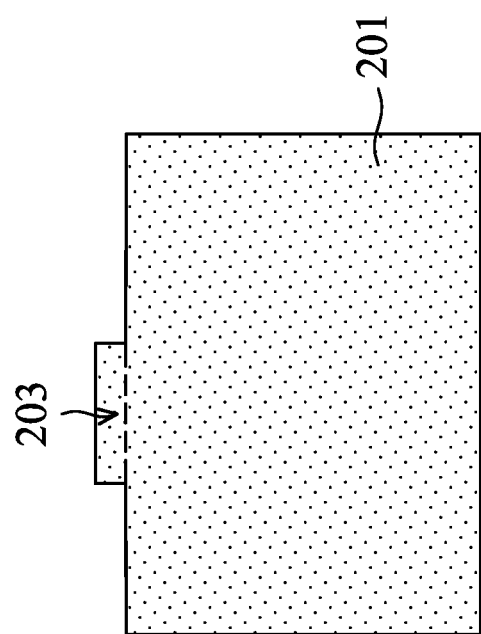

METHOD FOR FORMING A PACKAGE STRUCTURE FOR OPTICAL FIBER

CROSS REFERENCE TO RELATED APPLICATIONS

This Applications is a continuation application of application Ser. No. 16/874,219, filed on May 14, 2020, which is a divisional application of application Ser. No. 16/230,652, filed on Dec. 21, 2018, which claims the benefit of U.S. Provisional Application No. 62/752,683 filed on Oct. 30, 2018, and entitled "Package structure and method for forming the same", the entirety of which is incorporated by reference herein.

BACKGROUND

Optical signals are used for secure, high-speed data transmission between two devices. In some applications, a device capable of optical data transmission includes at least one integrated circuit (IC) or a chip having an optical component for transmitting and/or receiving optical signals. Also, the device usually has one or more other optical or electronic components (e.g. transistors), a waveguide for controlling the propagation of the optical signals from one component to another, and a carrier, such as a substrate of a printed circuit board (PCB), on which the chip equipped with the optical component and the one or more other components are mounted. Various approaches for mounting a chip equipped with an optical component on a substrate have been studied.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-2D are cross-sectional representations of various stages of forming a second portion of a reflector, in accordance with some embodiments of the disclosure.

DETAILED DESCRIPTION

Figure 1B:
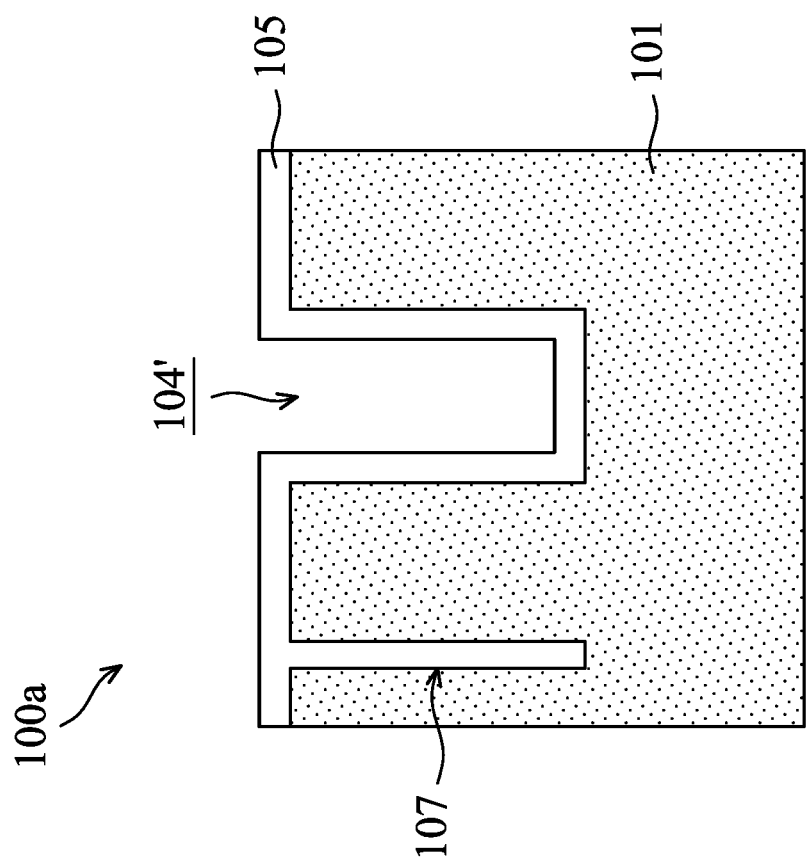
FIGS. 1A-1B are cross-sectional representations of various stages of forming a first portion of a reflector, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Other features and processes may also be included. For example, testing structures may be included to aid in the verification testing of the three-dimensional (3D) packaging or 3D IC devices. The testing structures may include, for example, test pads formed in a redistribution layer or on a substrate that allows the testing of the 3D packaging or 3D IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments for forming a package structure are provided. The package structure may include a reflector, a waveguide and an optical component over a substrate, and an optical fiber is configured to be connected to the package structure. The reflector may include a metal layer, which may efficiently change directions of optical signals. As a result, a minimized and integrated package structure may be obtained.

Figure 1A:
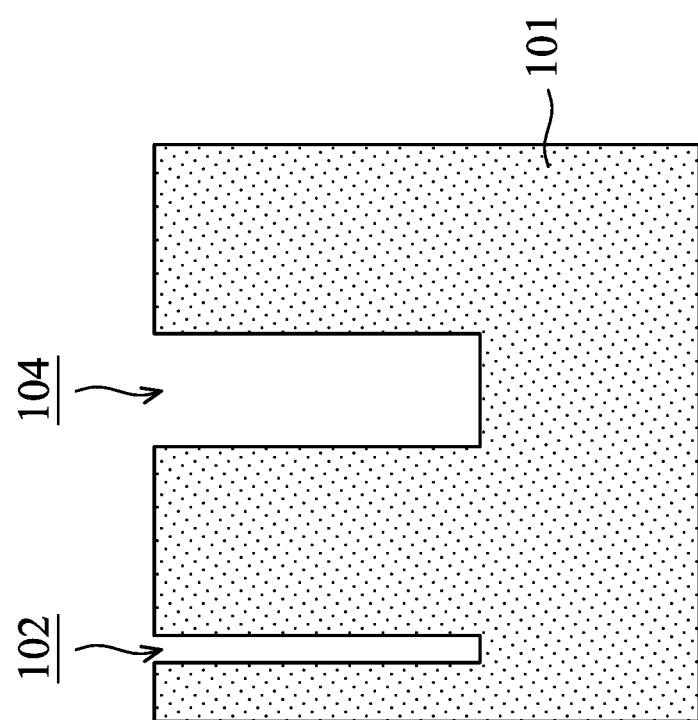

FIGS. 1A-1B are cross-sectional representations of various stages of forming a first portion 100a of a reflector, in accordance with some embodiments of the disclosure.

A first semiconductor layer 101 is provided, as shown in FIG. 1A in accordance with some embodiments. The first semiconductor layer 101 may include silicon. Alternatively or additionally, the first semiconductor layer 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenide, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

Afterwards, openings 102 and 104 are formed in the first semiconductor layer 101, as shown in FIG. 1A in accordance with some embodiments. The openings 102 and 104 may be formed by a procedure including photolithography patterning and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching (RIE)).

After the openings 102 and 104 are formed, a dielectric layer 105 is formed over a surface of the first semiconductor layer 101, as shown in FIG. 1B in accordance with some embodiments. More specifically, the opening 102 is filled by the dielectric layer 105 such that a first alignment mark 107 is formed in the first semiconductor layer 101, which is configured to provide an alignment function in the subsequent processes. In addition, a portion of the dielectric layer 105 is formed in the opening 104 such that a reduced opening 104' is obtained.

In some embodiments, the dielectric layer 105 is formed by a thermal oxidation process. In some embodiments, the dielectric layer 105 is formed by a deposition process, which may include a chemical vapor deposition (CVD) process, a high-density plasma chemical vapor deposition (HDPCVD) process, an atomic layer deposition (ALD) process, a physical vapor deposition (PVD) process, another applicable process, or a combination thereof. In some embodiments, the dielectric layer 105 is made of silicon oxide, silicon nitride, silicon oxynitride, or another applicable dielectric material. After the dielectric layer 105 is formed, the first portion 100a of a reflector may be obtained.

FIGS. 2A-2D are cross-sectional representations of various stages of forming a second portion 200 of a reflector, in accordance with some embodiments of the disclosure.

A second semiconductor layer 201 is provided, as shown in FIG. 2A in accordance with some embodiments. The second semiconductor layer 201 may include silicon. Some materials used to form the second semiconductor layer 201 may be similar to, or the same as, those used to form the first semiconductor layer 101 described previously and are not repeated herein. It should be noted that, the second semiconductor layer 201 includes a protruding portion 203, which may be formed by a procedure including photolithography patterning and etching processes. The details of the photolithography patterning and etching processes may be similar to, or the same as, those described previously and are not repeated herein.

Next, an opening 202 is formed in the second semiconductor layer 201, as shown in FIG. 2B in accordance with some embodiments. Some processes used to form the opening 202 may be similar to, or the same as, those used to form the opening 102 described previously and are not repeated herein.

Afterwards, a dielectric layer 205 is formed over a surface of the second semiconductor layer 201, as shown in FIG. 2C in accordance with some embodiments. More specifically, the opening 202 is filled by the dielectric layer 205 such that a second alignment mark 207 is formed in the second semiconductor layer 201, which is configured to provide an alignment function in the subsequent processes. In addition, the protruding portion 203 is conformally covered by the dielectric layer 205. Some processes and materials used to form the dielectric layer 205 may be similar to, or the same as, those used to form the dielectric layer 105 described previously and are not repeated herein.

Then, a planarizing process is performed on the second semiconductor layer 201 to expose the protruding portion 203, as shown in FIG. 2D in accordance with some embodiments. In some embodiments, the planarizing process includes a grinding process, a chemical mechanical polishing (CMP) process, an etching process, another applicable process, or a combination thereof. After performing the planarizing process, the second portion 200 of a reflector may be obtained.

FIGS. 3A-3D are cross-sectional representations of various stages of forming a reflector 300a, in accordance with some embodiments of the disclosure.

Figures 3A, 3B:
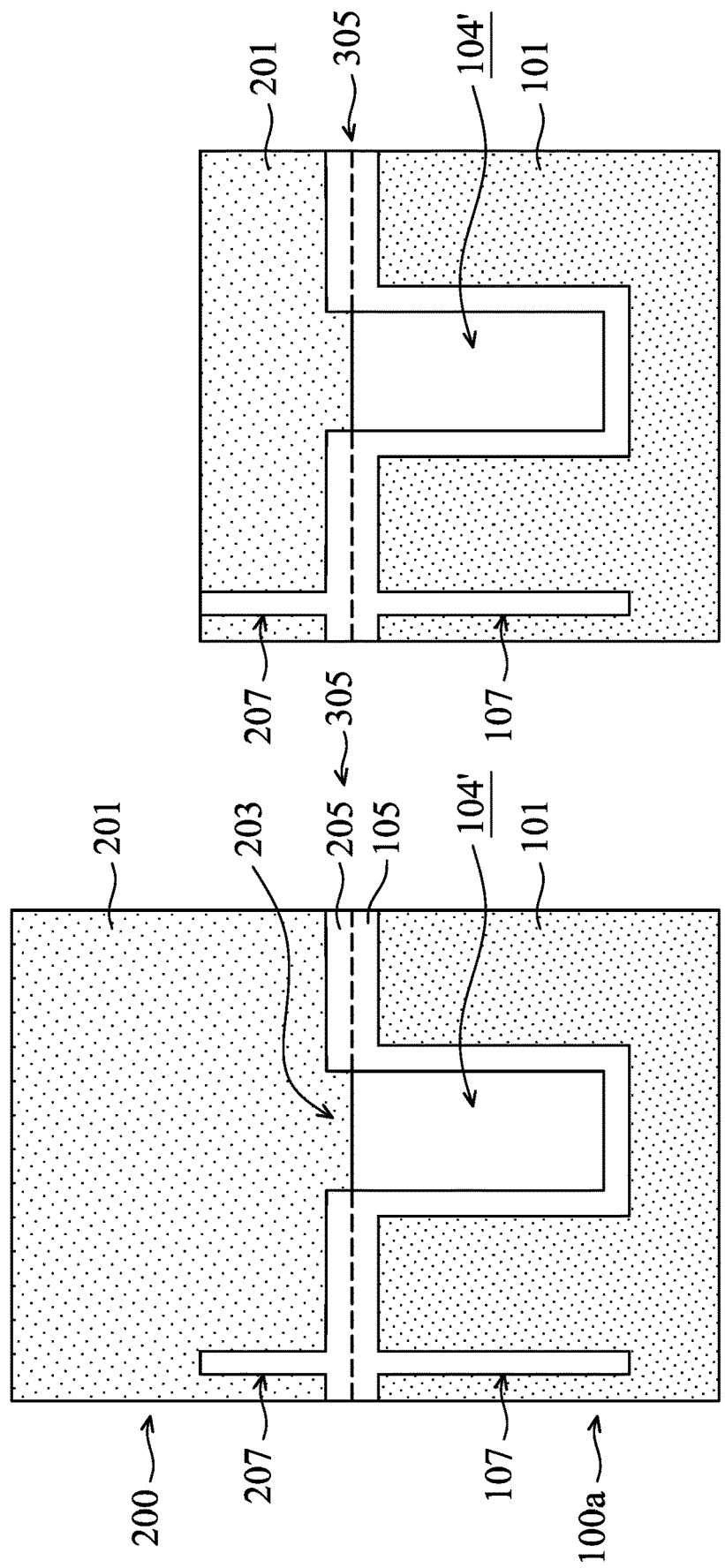
FIGS. 3A-3D are cross-sectional representations of various stages of forming a reflector, in accordance with some embodiments of the disclosure.

The second portion 200 of FIG. 2D is turned upside down and then is bonded to the first portion 100a of FIG. 1B, as shown in FIG. 3A in accordance with some embodiments. In some embodiments, the dielectric layer 205 of the second portion 200 faces the dielectric layer 105 of the first portion 100a, and the second portion 200 is bonded to the first portion 100a with the second alignment mark 207 aligned with the first alignment mark 107. Moreover, in some embodiments, the protruding portion 203 is aligned with the reduced opening 104' such that the reduced opening 104' is covered by the protruding portion 203 of the second portion 200.

In some embodiments, the second portion 200 is bonded to the first portion 100a by a thermal process. During the thermal process, the dielectric layer 205 combined with the dielectric layer 105 such that a combined dielectric layer 305 is formed between the first portion 100a and the second portion 200, and the reduced opening 104' is enclosed by the protruding portion 203 and the combined dielectric layer 305.

After the second portion 200 is bonded to the first portion 100a, a planarization process is performed on the second semiconductor layer 201, as shown in FIG. 3B in accordance with some embodiments. It should be noted that, the planarization process is performed until a desired thickness of the second semiconductor layer 201 is obtained. The desired thickness of the second semiconductor layer 201 will be described in detail later. In some embodiments, the planarizing process includes a grinding process, a chemical mechanical polishing (CMP) process, an etching process, another applicable process, or a combination thereof.

Figure 3D:
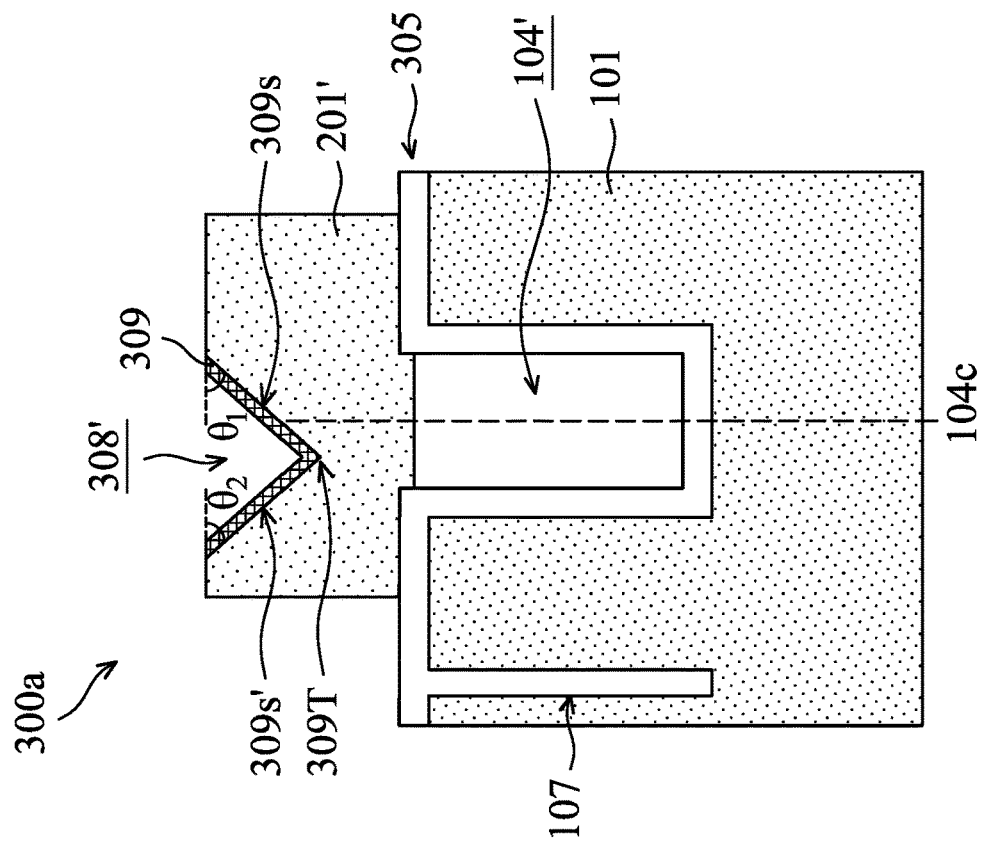
Figure 3C:
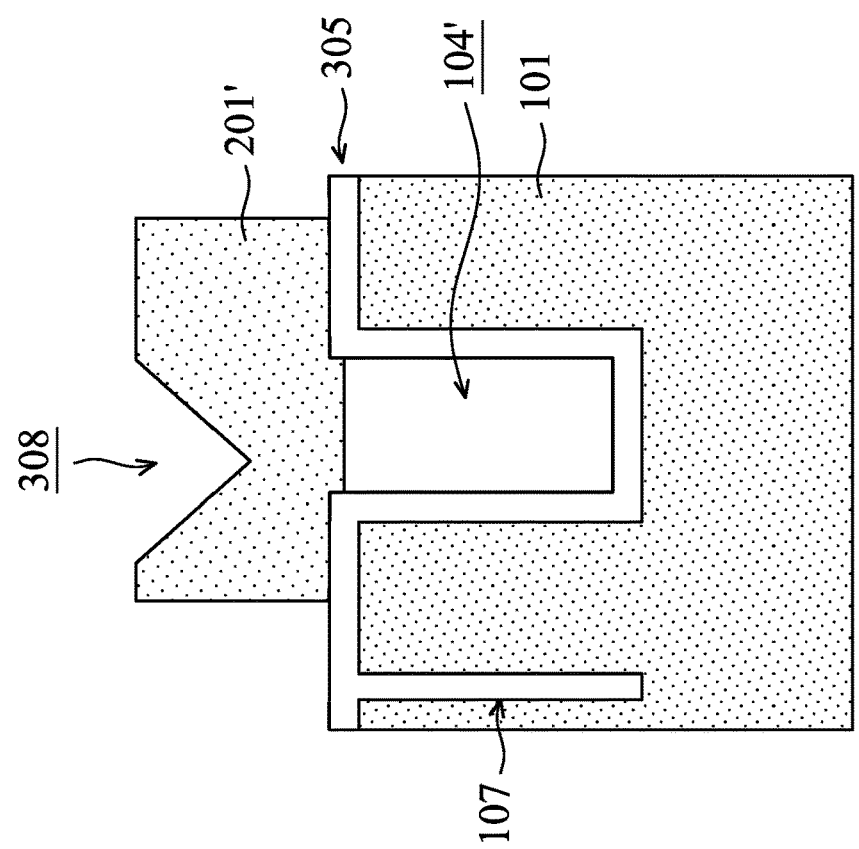

After performing the planarizing process, the second semiconductor layer 201 is patterned to form an opening 308 in a patterned second semiconductor layer 201', as shown in FIG. 3C in accordance with some embodiments. The opening 308 and the patterned second semiconductor layer 201' may be formed by a procedure including one or more photolithography patterning and etching processes. The details of the photolithography patterning and etching processes may be similar to, or the same as, those described previously and are not repeated herein.

Afterwards, a metal layer 309 is formed lining the opening 308, and a reduced opening 308' is obtained, as shown in FIG. 3D in accordance with some embodiments. As a result, a reflector 300a is obtained. It should be noted that, before the metal layer 309 is formed, the opening 308 has a V-shaped cross-section with a tip pointing toward the combined dielectric layer 305. Therefore, the metal layer 309 lining the opening 308 also has a tip 309T pointing along a direction from the patterned second semiconductor layer 201' to the first semiconductor layer 101. In some embodiments, the metal layer 309 is also V-shaped.

In some embodiments, the patterned second semiconductor layer 201' has a first surface facing the combined dielectric layer 305 and a second surface opposite to the first surface, and an angle $\theta_1$ is formed between an extension line of the second surface of the patterned second semiconductor layer 201' and a tilted sidewall 309s of the metal layer 309. It should be noted that, the tilted sidewall 309s of the metal layer 309 is a portion of the interface between the metal layer 309 and the patterned second semiconductor layer 201'. In some embodiments, the angle $\theta_1$ is an acute angle.

In some embodiments, the angle $\theta_1$ is in a range from about 40 degrees to about 70 degrees. If the angle $\theta_1$ is too small (i.e. smaller than 40 degrees) or too large (i.e. greater than 70 degrees), the optical signals may not be efficiently transmitted to the desired destinations after being reflected by the metal layer 309.

In addition, the tip 309T is intersected by the tilted sidewall 309s and another tilted sidewall 309s' of the metal layer 309. In some embodiments, an angle $\theta_2$ is formed between the tilted sidewall 309s' and an extension line of the second surface of the patterned second semiconductor layer 201', which is opposite to the first surface facing the combined dielectric layer 305.

In some embodiments, the angle $\theta_2$ is in a range from about 40 degrees to about 70 degrees, and the angle $\theta_2$ between the tilted sidewall 309s' and the second surface of the patterned second semiconductor layer 201' is substantially the same as, or similar to, the acute angle $\theta_1$ between the tilted sidewall 309s and the second surface of the patterned second semiconductor layer 201'. Therefore, the reduced opening 308' may have a symmetric cross-section.

In some embodiments, the reduced opening 104' has a central axis 104c, as shown in FIG. 3D in accordance with some embodiments. Since there is no optical path designed to be turned by the tilted sidewall 309s' of the metal layer 309, the tip 309T of the metal layer 309 is shifted from the central axis 104c. However, in some embodiments, an optical path is designed to be turned by the tilted sidewall 309s' of the metal layer 309. Thus, the tip 309T of the metal layer 309 is aligned with the central axis 104c, which will be described in detail later.

In some embodiments, the metal layer 309 is formed by a procedure including deposition, photolithography patterning, and etching processes. The deposition processes may include CVD, metal organic CVD (MOCVD), sputtering, or electroplating. The details of the photolithography patterning and etching processes may be similar to, or the same as, those described previously and are not repeated herein. In some embodiments, the metal layer 309 is made of aluminum, aluminum/silicon/copper alloy, copper, titanium nitride, nickel, tungsten, metal silicide, or a combination thereof.

FIGS. 4A-4D are cross-sectional representations of various stages of forming a package structure 400a, in accordance with some embodiments of the disclosure. The package structure 400a may be a chip-on-wafer-on-substrate (CoWoS) package or another suitable package.

Figure 4A:
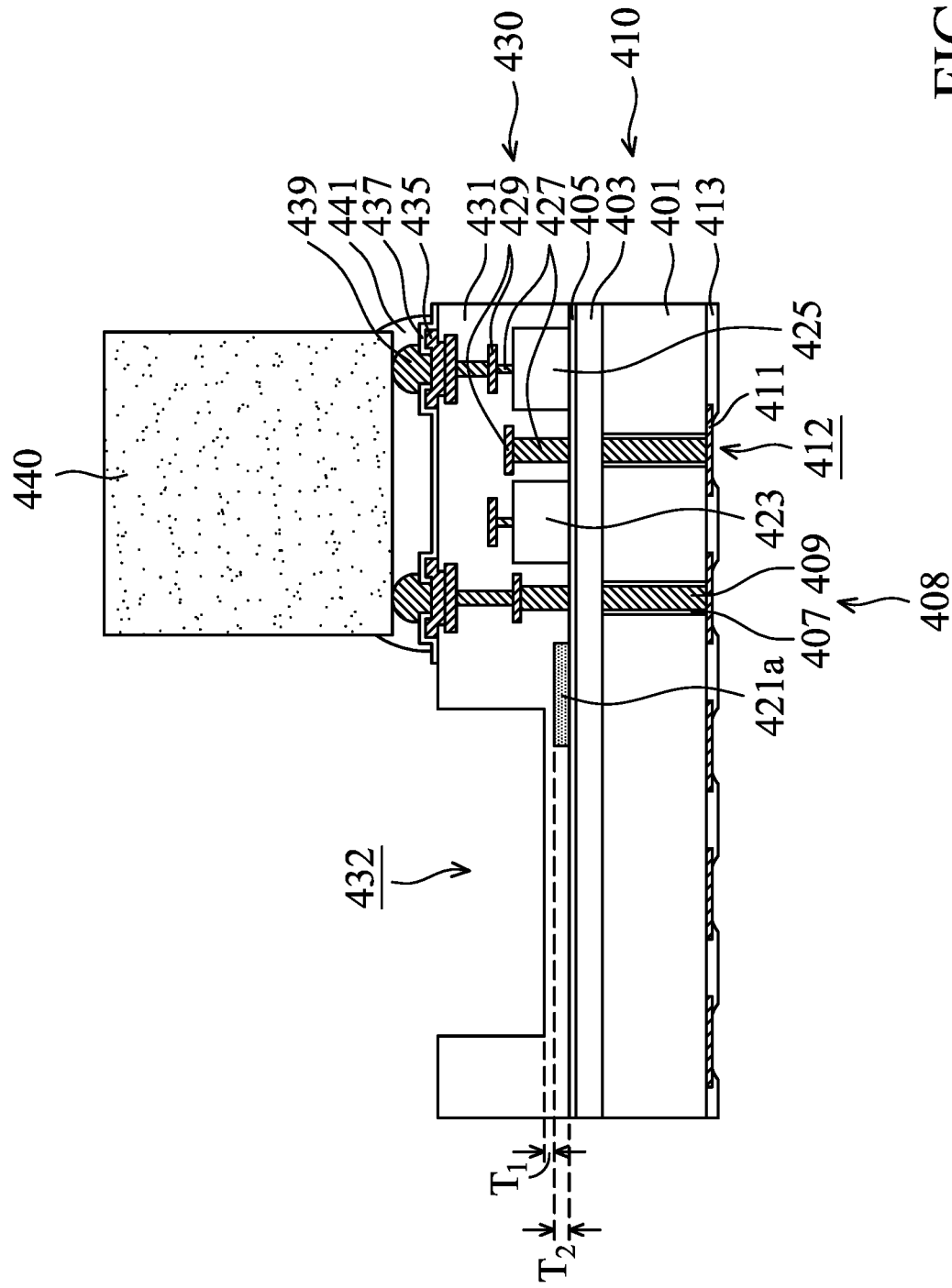
FIGS. 4A-4D are cross-sectional representations of various stages of forming a package structure, in accordance with some embodiments of the disclosure.

A package component 410 is provided, as shown in FIG. 4A in accordance with some embodiments. In some embodiments, the package component 410 is an interposer or another suitable component. The interposer may be substantially free of active elements, such as transistors, diodes, or other active elements. The interposer may include, or may be substantially free of passive elements, such as capacitors, resistors, inductors, or other passive elements.

In some embodiments, the package component 410 includes a substrate 401, an insulating layer 403, and a semiconductor layer 405. In some embodiments, the substrate 401 is a wafer, such as a silicon wafer, and the insulating layer 403 may be, for example, a buried oxide (BOX) layer, a silicon oxide layer, or the like. In addition, the semiconductor layer 405 may be silicon, another elementary semiconductor material, or a compound semiconductor, and the semiconductor layer 405 may be doped (e.g. with a P-type or an N-type dopant) or undoped.

In some embodiments, one or more through-substrate vias (TSVs) 408 are formed in the substrate 401. The TSVs 408 may be referred to as through-silicon vias. In some embodiments, each of the TSVs 408 includes an insulating layer 340 and a conductive feature 409 surrounded by the insulating layer 340. The conductive features 409 are separated from the substrate 401 by the insulating layer 340. In some embodiments, the conductive features 409 include copper (Cu), aluminum (Al), nickel (Ni), platinum (Pt), lead-free solder (e.g., SnAg, SnCu, SnAgCu), another suitable conductive material, or a combination thereof.

Moreover, in some embodiments, conductive features 411 are formed over a surface of the substrate 401, which is opposite to the surface covered by the insulating layer 403, and a passivation layer 413 is formed over the conductive features 411. The conductive features 411 may be partially exposed by openings 412 in the passivation layer 413, and the conductive features 411 may be in electrical contact with the TSVs 408. In addition, the conductive features 411 may be conductive pads or conductive lines, and the passivation layer 413 may be a multi-layer structure.

An optical component 423 and an electronic component 425 are formed over the semiconductor layer 405 of the package component 410, as shown in FIG. 4A in accordance with some embodiments. In some embodiments, the optical component 423 includes a light emitting device such as a light emitting diode or a laser, a light detecting device such as a photo-sensor, an optical modulator, an optical coupler, another applicable component, or a combination thereof.

In some embodiments, the electronic component 425 includes a transistor, a resistor, a capacitor, a diode, another applicable component, or a combination thereof. Although only one optical component 423 and one electronic component 425 are shown in FIG. 4A, the scope of the disclosure is not limited thereto. For example, there can be more than one optical component 423 and/or electronic component 425.

A waveguide 421a is formed over the semiconductor layer 405 of the package component 410 and adjacent to the optical component 423, as shown in FIG. 4A in accordance with some embodiments. The waveguide 421*a* may include a core region and a cladding layer surrounding the core region, the core region and the cladding layer have different reflective coefficients and are arranged to allow an optical signal of a predetermined wavelength to travel within the core region by total internal reflection.

In some embodiments, the core region of the waveguide 421*a* includes a semiconductor material such as silicon, a polymer material, a dielectric material such as silicon nitride, or a combination thereof, and the cladding layer of the waveguide 421*a* includes a dielectric material such as silicon dioxide ($SiO_2$), silicon carbide (SiC), carbon nitride (CN), silicon oxynitride (SiON), silicon nitride (SiN), or another applicable material.

In some embodiments, an interconnect structure 430 is formed over the waveguide 421*a*, the optical component 423 and the electronic component 425. The interconnect structure 430 includes one or more redistribution layers and one or more passivation layers. For example, the interconnect structure 430 includes conductive layers 429 and conductive vias 427 in a passivation layer 431.

The passivation layer 431 may include multiple sub-layers. In some embodiments, the passivation layer 431 in the interconnect structure 430 is made of polybenzoxazole (PBO), benzocyclobutene (BCB), silicone, acrylates, siloxane, another suitable material, or a combination thereof. In some embodiments, the passivation layer 431 in the interconnect structure 430 is made of non-organic materials. The non-organic materials includes silicon oxide, un-doped silicate glass, silicon oxynitride, solder resist (SR), silicon nitride, silicon carbide, hexamethyldisilazane (HMDS), another suitable material, or a combination thereof.

In some embodiments, the conductive layers 429 and the conductive vias 427 in the interconnect structure 430 are made of metal materials. The metal materials include copper (Cu), Cu alloy, aluminum (Al), Al alloy, tungsten (W), W alloy, titanium (Ti), Ti alloy, tantalum (Ta), Ta alloy, another applicable material, or a combination thereof.

In addition, under-bump metallurgy (UBM) elements 435 are formed over the passivation layer 431, a passivation layer 437 is formed over the UBM elements 435, and each of the UBM elements 435 is partially exposed by the passivation layer 437, as shown in FIG. 4A in accordance with some embodiments. The UBM elements 437 may be made of titanium, titanium nitride, tantalum, tantalum nitride, tungsten, titanium tungsten, nickel, gold, chrome, copper, copper alloy, another suitable material, or a combination thereof. Some materials used to form the passivation layer 437 may be similar to, or the same as, those used to form the passivation layer 431 described previously and are not repeated herein.

In some embodiments, a chip (integrated circuit die) 440 is bonded to the interconnect structure 430 through conductive features 439, and the conductive features 439 are surrounded by a molding material 441. The conductive features 439 may be conductive bumps or other conductive elements, and the molding material 441 may include liquid epoxy, deformable gel, silicon rubber, another suitable material, or a combination thereof.

In some embodiments, the molding material 441 includes an epoxy-based resin with fillers dispersed therein. The fillers may include insulating fibers, insulating particles, other suitable elements, or a combination thereof. In some embodiments, a dispensing process is performed to form the molding material 441.

In some embodiments, the chip 440 is sawed from a wafer, and may be a "known-good-die". In some embodiments, the chip 440 is a logic die, a memory die, or another applicable type of die. In some embodiments, the chip 440 includes a semiconductor substrate, passivation layer(s), and conductive feature(s).

In some embodiments, the chip 441 is disposed directly over the electronic component 425 and the optical component 423, and a portion of the passivation layer 431 is removed such that an opening 432 is formed adjacent to the optical component 423, as shown in FIG. 4A in accordance with some embodiments.

More specifically, in some embodiments, the waveguide 421*a* remains covered by the passivation layer 431 after the opening 432 is formed, and a portion of the opening 432 is directly above the waveguide 421*a*. In some embodiments, a portion of the passivation layer 431 directly above the waveguide 421*a* has a first thickness $T_1$, the waveguide 421*a* has a second thickness $T_2$, and a ratio ($T_1/T_2$) of the first thickness $T_1$ to the second thickness $T_2$ is smaller than about 0.5.

If the ratio ($T_1/T_2$) is too large (i.e. greater than 0.5), the optical signals may not be efficiently transmitted (vibrated along a vertical direction) to the waveguide 421*a*. In some embodiments, the waveguide 421*a* is partially exposed by the opening 432.

Figure 4B:
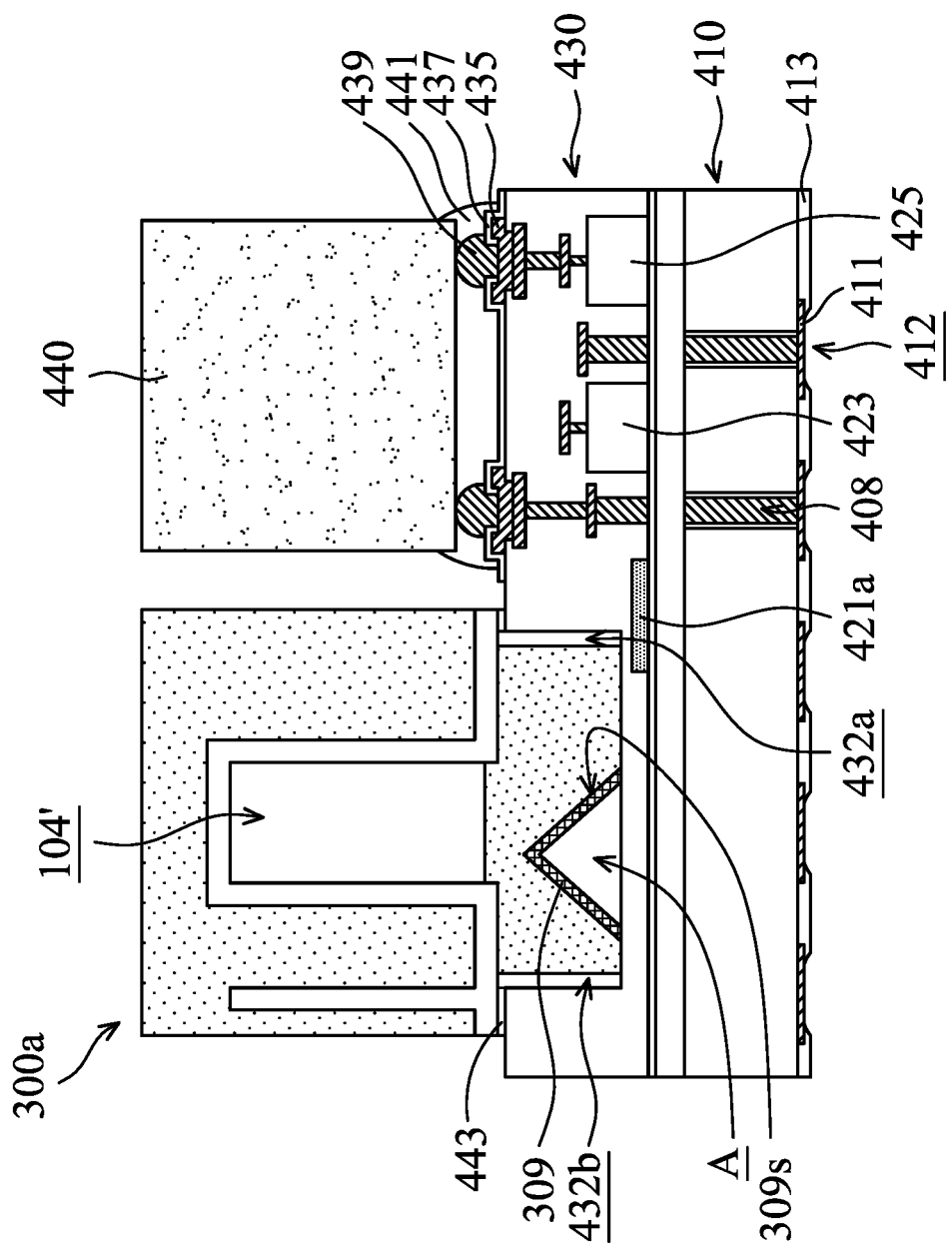

Afterwards, the reflector 300*a* shown in FIG. 3D is flipped upside down and then is bonded to the passivation layer 431, and the metal layer 309 and the patterned second semiconductor layer 201' are disposed in the opening 432, as shown in FIG. 4B in accordance with some embodiments. In some embodiments, the reflector 300*a* is bonded to the passivation layer 431 by an adhesive layer 433, and the tilted sidewall 309*s* faces the waveguide 421*a*.

After the reflector 300*a* is bonded to the passivation layer 431, the reduced opening 308' is enclosed by the metal layer 309 and the passivation layer 431 such that a space A with triangular cross-section is formed, and the metal layer 309 has an inversed V-shaped cross-section. In some embodiments, the opening 432 is not entirely filled by the reflector 300*a*, such that a gap is formed between the patterned second semiconductor layer 201' and the passivation layer 431, such as gaps 432*a* and 432*b*.

Figure 4C:
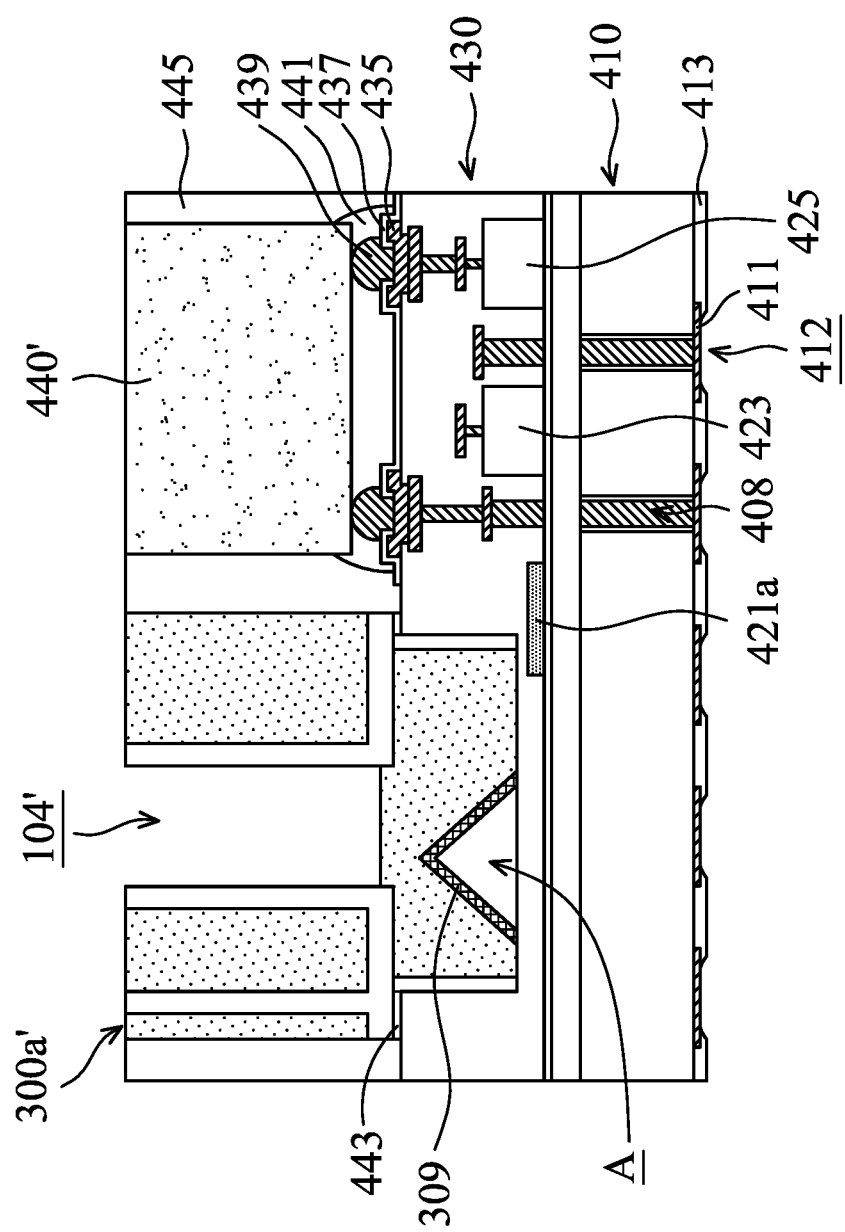

A molding material 445 is formed surrounding the reflector 300*a* and the chip 440, and a planarizing process is performed on the reflector 300*a* and the chip 440 such that a planarized reflector 300*a'* and a planarized chip 440' are formed, as shown in FIG. 4C in accordance with some embodiments. More specifically, the reduced opening 104' is reopened from the side opposite to the side facing the passivation layer 431. Some materials used to form the molding material 445 may be similar to, or the same as, those used to form the molding material 441 described previously and are not repeated herein.

Figure 4D:
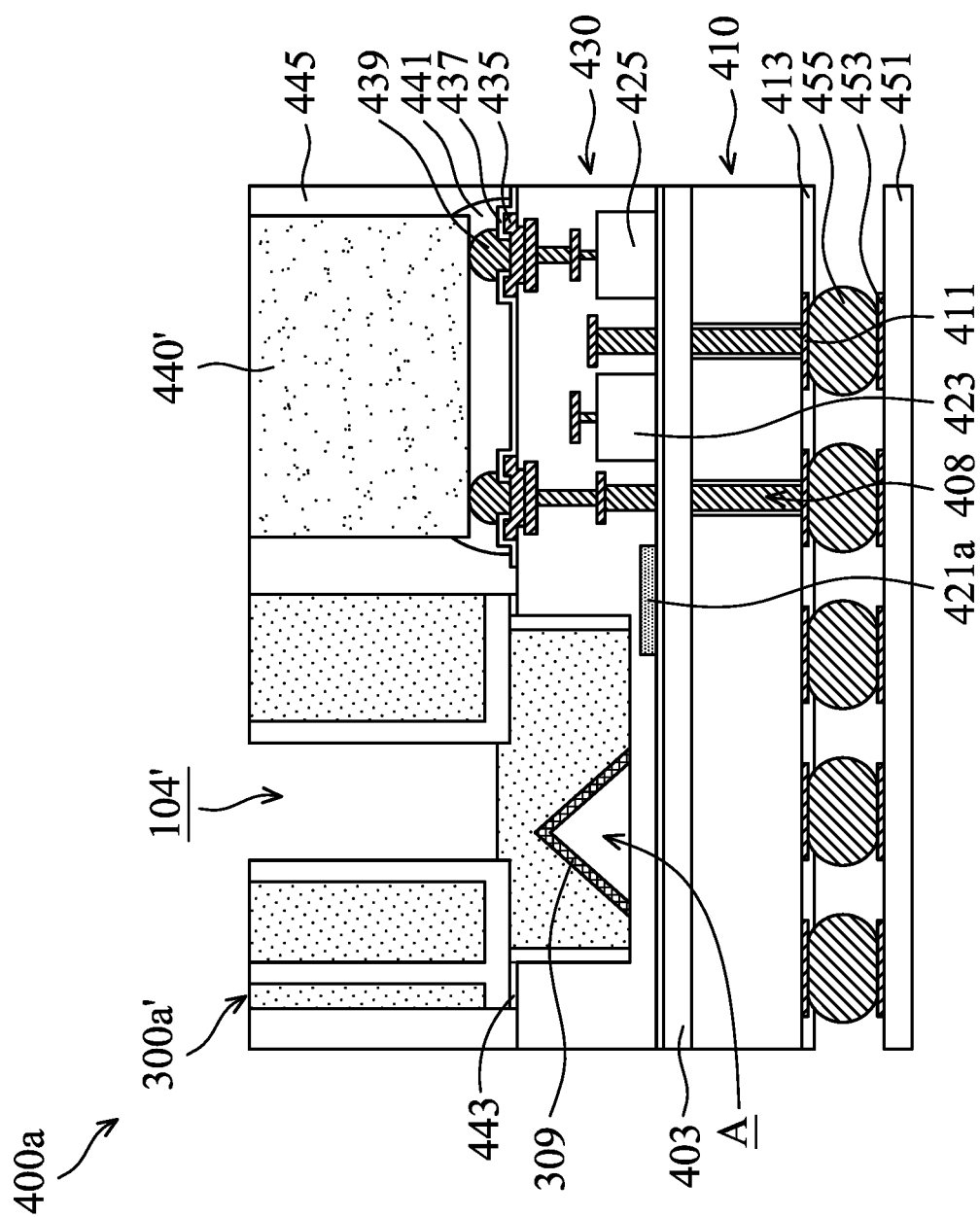

After the planarizing process is performed, the package component 410 is bonded to a substrate 451 through bumps 455, as shown in FIG. 4D in accordance with some embodiments. In some embodiments, the substrate 451 is a printed circuit board (PCB), another package structure, or another suitable substrate. The bumps 455 are electrically connected to conductive features 453, such as conductive pads, over the substrate 451. In some embodiments, the conductive features 453 and the bumps 455 are substantially aligned to each other. As a result, a package structure 400*a* is obtained.

Figure 4E:
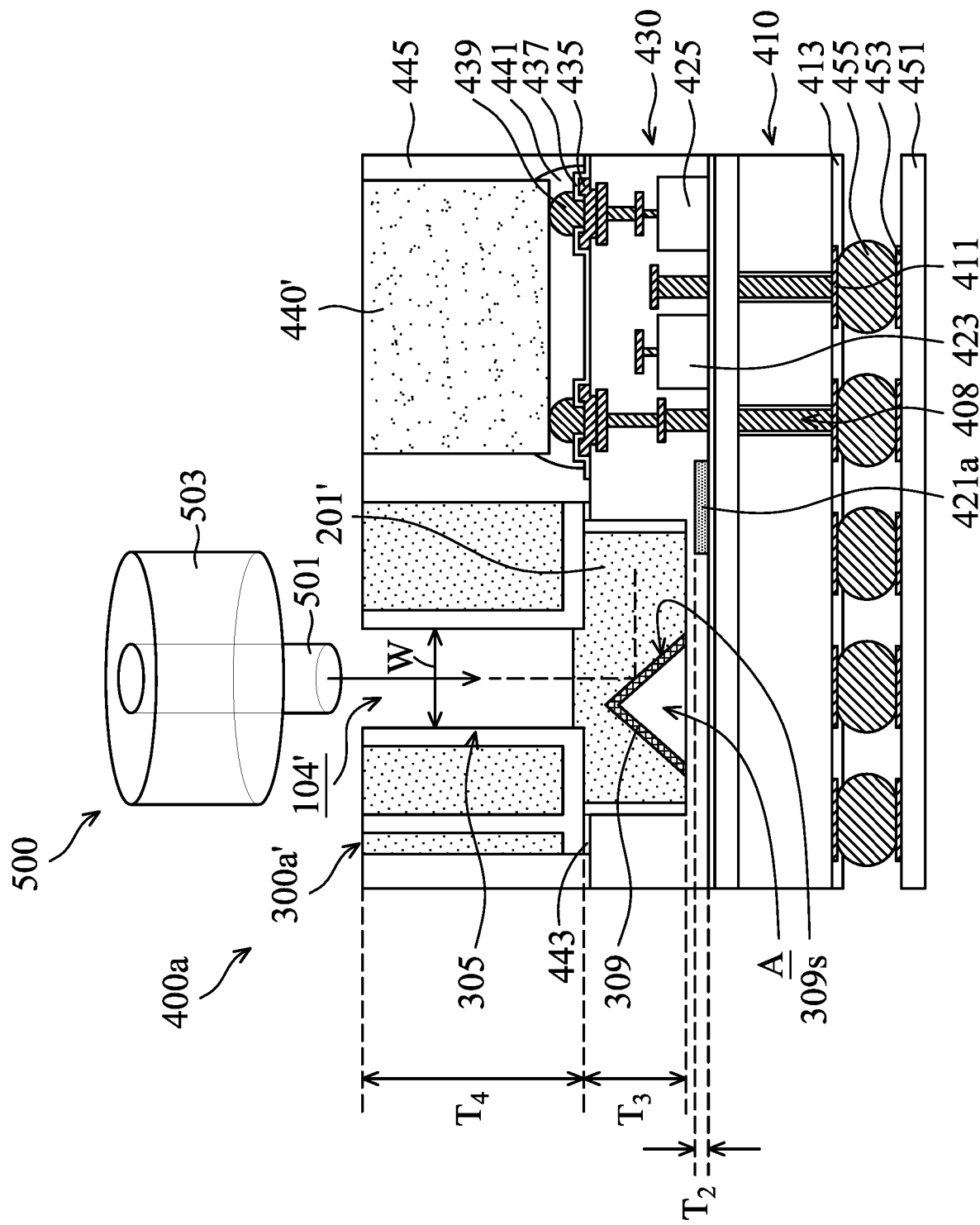
FIG. 4E shows an application of the package structure of FIG. 4D, in accordance with some embodiments of the disclosure.

FIG. 4E shows an application of the package structure 400*a* of FIG. 4D, in accordance with some embodiments of the disclosure.

In some embodiments, the package structure 400*a* is used for connecting with an optical fiber 500, which includes a core region 501 and a cladding layer 503 surrounding the core region 501, as shown in FIG. 4E in accordance with some embodiments. Some materials used to form the core region 501 and the cladding layer 503 may be similar to, or the same as, those used to form the core region and the cladding layer of the waveguide 421a described previously and are not repeated herein. In some embodiments, the core region 501 of the optical fiber 500 is inserted into the reduced opening 104' (as shown by the arrow pointing downward), and an optical path between the optical fiber 500 and the waveguide 421a is formed.

More specifically, optical signals may be emitted from the optical fiber 500, reflected (turned) by the tilted sidewall 309s of the metal layer 309, transmitted by the patterned second semiconductor layer 201' and the waveguide 421a, and then, received by the optical component 423. Alternatively, optical signals may be emitted from the optical component 423, transmitted by the waveguide 421a and the patterned second semiconductor layer 201', reflected (turned) by the tilted sidewall 309s of the metal layer 309, and then, received by the optical fiber 500.

In some embodiments, the patterned second semiconductor layer 201' is transparent. Therefore, optical signals may be transmitted through the patterned second semiconductor layer 201'. In addition, optical signals may be transformed to electronic signals and transmitted to the planarized chip 440' through the interconnect structure 430. Alternatively, optical signals may be transformed from electronic signals, which is sent out from the planarized chip 440' through the interconnect structure 430.

In some embodiments, the portion of the patterned second semiconductor layer 201' under the combined dielectric layer has a third thickness $T_3$, and the reduced opening 104' has a width W, the width W is greater than the third thickness $T_3$, and the third thickness $T_3$ is greater than the second thickness $T_2$ of the waveguide 421a. It should be noted that the difference between the width W and the second thickness $T_2$ of the waveguide 421a is large. Therefore, optical signals may be easily and efficiently transmitted between the large-sized reduced opening 104' and the small-sized waveguide 421a.

In some embodiments, the width W is in a range from about 3 μm to about 70 μm. In some embodiments, the third thickness $T_3$ is in a range from about 3 μm to about 5 μm. In some embodiments, the second thickness $T_2$ of the waveguide 421a is in a range from about 150 μm to about 250 μm. In addition, a fourth thickness $T_4$ of the portion of the combined dielectric layer 305 surrounding the reduced opening 104' may be in a range from about 80 μm to about 250 μm.

Embodiments of the package structure 400a includes the planarized reflector 300a', which allow the optical fiber 500 to be connected to the package structure 400a by a self-aligned process. The planarized reflector 300a' includes the metal layer 309, which can change directions of optical signals. Therefore, the optical path in the package structure may not be limited by the guard rings or seal rings in the package structure 400a.

Moreover, optical signals can be easily and efficiently transmitted between two regions having a large size difference by the planarized reflector 300a'. As a result, the size of the package structure 400a may be minimized, which allow more components to be integrated into a given area in the package structure 400a. Furthermore, the package structure 400a may be a chip-on-wafer-on-substrate (CoWoS) package. Thus, a wafer-level test may be performed on the package structure 400a. In addition, the package structure 400a is compatible with a system of dense wavelength division multiplexing (DWDM).

Figure 5:
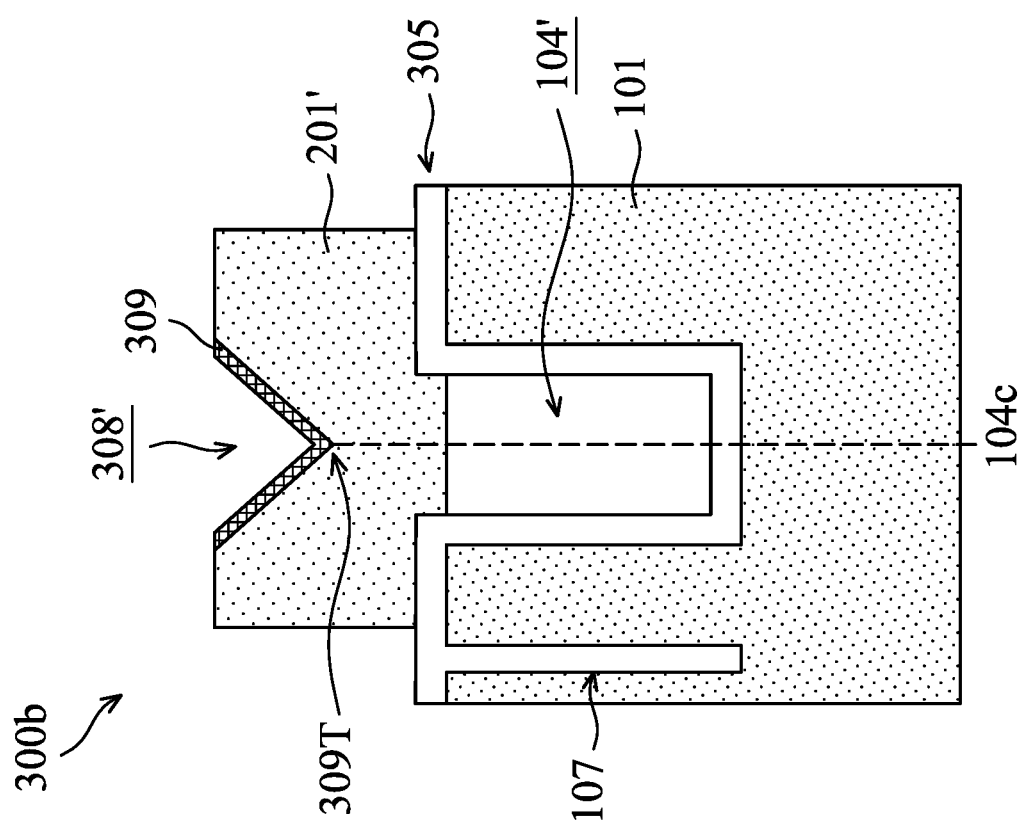
FIG. 5 is a cross-sectional representation of a modified reflector, in accordance with some embodiments of the disclosure.

FIG. 5 is a cross-sectional representation of a modified reflector 300b, in accordance with some embodiments of the disclosure. The modified reflector 300b is similar to the reflector 300a of FIG. 3D, and the difference between FIG. 5 and FIG. 3D is that the tip 309T of the metal layer 309 is aligned with the central axis 104c of the reduced opening 104' in FIG. 5.

Figure 6:
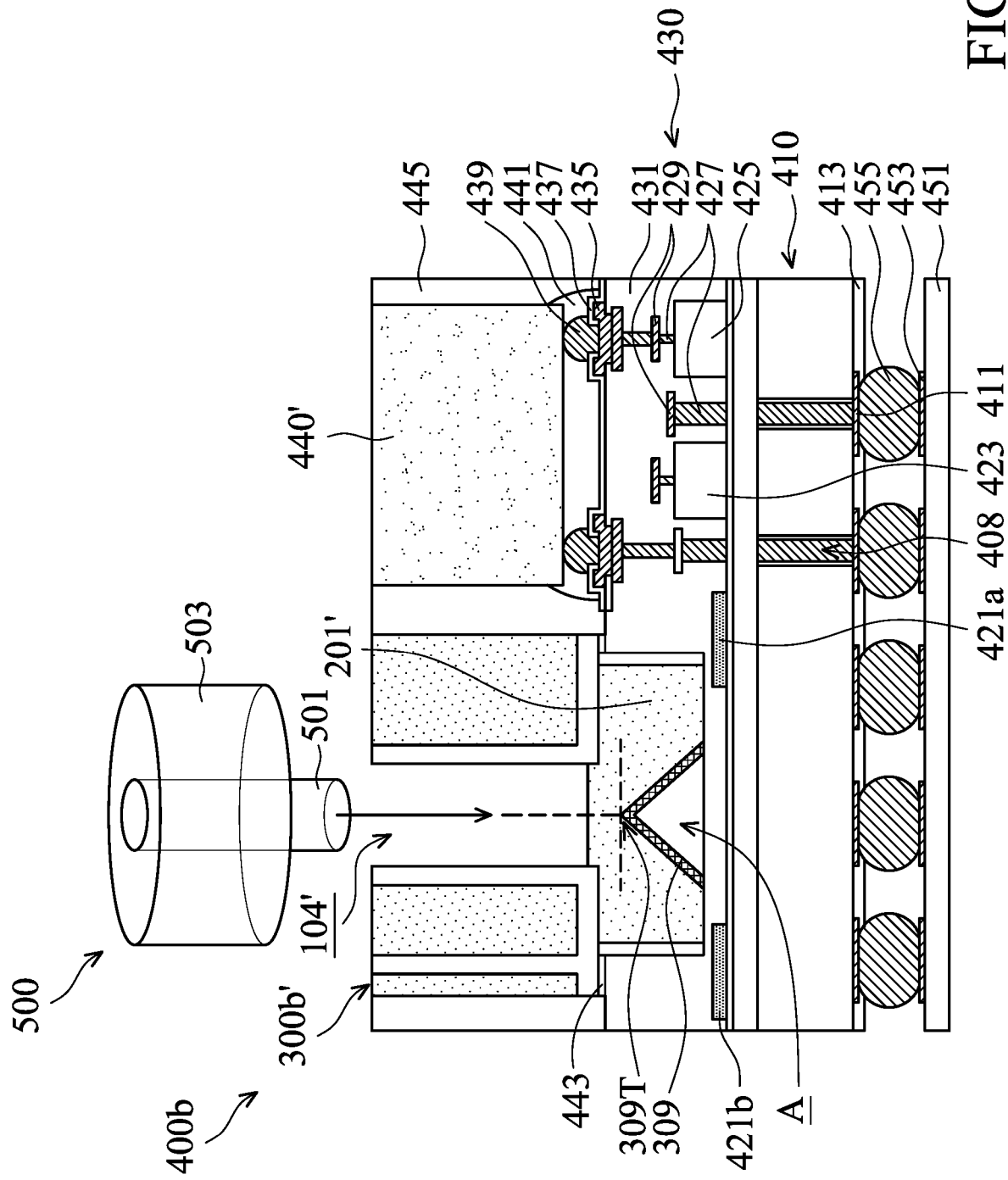
FIG. 6 shows an application of a modified package structure, in accordance with some embodiments of the disclosure.
Figure 7B:
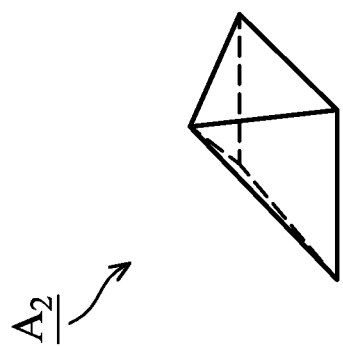
FIGS. 7A and 7B are perspective representations of a space in a package structure, in accordance with some embodiments of the disclosure.
Figure 7A:
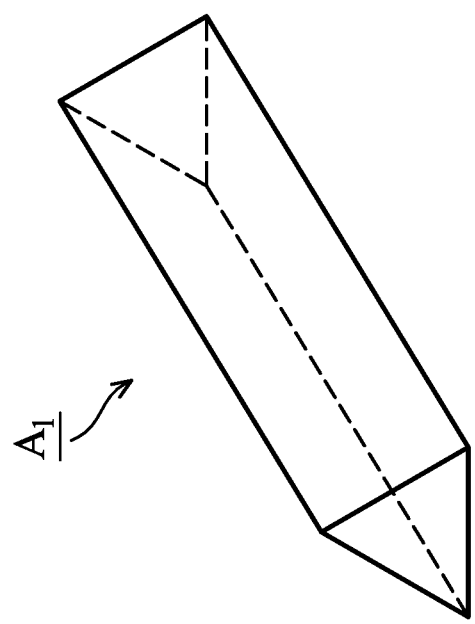

FIG. 6 shows an application of a modified package structure 400b, in accordance with some embodiments of the disclosure. FIG. 7A is a perspective representation of the space A in the package structure 400b, in accordance with some embodiments of the disclosure. FIG. 7B is a perspective representation of the space A in the package structure 400b, in accordance with some embodiments of the disclosure.

Some processes used to form the modified package structure 400b may be similar to, or the same as, those used to form the package structure 400a described previously and are not repeated herein. The difference between FIG. 6 and FIG. 4E is that the planarized reflector 300a' is replaced by the planarized reflector 300b', and there is another waveguide 421b disposed in FIG. 6. The planarized reflector 300b' is formed by the modified reflector 300b shown in FIG. 5.

In some embodiments, there are two waveguides 421a and 421b disposed at two opposite sides of the metal layer 309. Since the tip 309T of the metal layer 309 is aligned with the central axis 104c of the reduced opening 104', optical signals emitted from the optical fiber 500 may be reflected by the tip 309T of the metal layer 309, and split into two beams of optical signals, which may be respectively transmitted to the waveguide 421a and the waveguide 421b. Alternatively, optical signals emitted from the waveguides 421a and 421b may be combined and reflected by the tip 309T of the metal layer 309, and then transmitted to the optical fiber 500.

In some embodiments, the space A enclosed by the metal layer 309 and the passivation layer 431 is a triangular prism $A_1$, as shown in FIG. 7A. More specifically, one of the rectangle surfaces of the triangular prism $A_1$ faces the waveguides 421a and 421b. In these cases, optical signals may be split into two beams, or combined by two beams.

In some embodiments, the space A enclosed by the metal layer 309 and the passivation layer 431 is a square pyramid $A_2$, as shown in FIG. 7B. More specifically, the square surface of the square pyramid $A_2$ faces the waveguides 421a and 421b. In these cases, the number of the waveguides disposed in the package structure may be increased to four, and each of the waveguides is disposed facing each remaining surfaces of the square pyramid $A_2$. Moreover, in these cases, optical signals may be split into four beams, or combined by four beams. Embodiments of the package structure 400b with the triangular prism $A_1$ or the square pyramid $A_2$ give an advantage in high bandwidth applications since the signals may be increased up to 4 times.

FIGS. 8A-8D are cross-sectional representations of various stages of forming a modified first portion 100b of a reflector, in accordance with some embodiments of the disclosure.

Figure 8B:
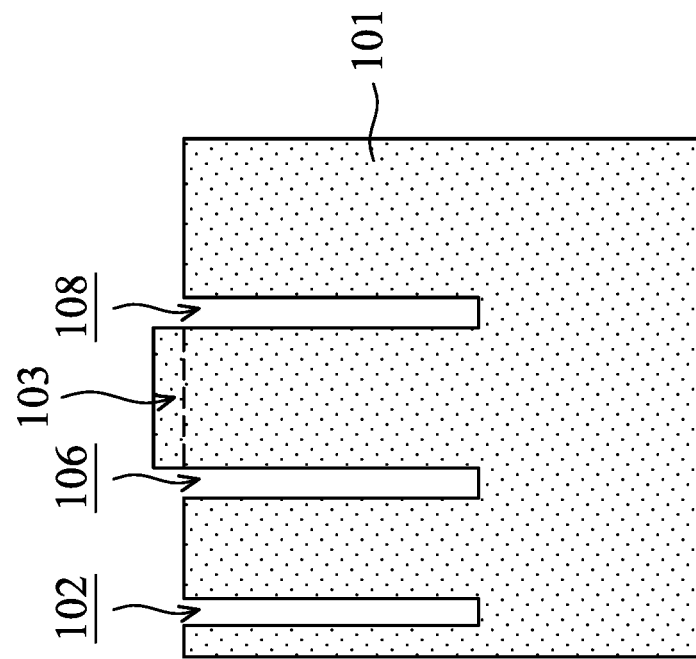
FIGS. 8A-8D are cross-sectional representations of various stages of forming a modified first portion of a reflector, in accordance with some embodiments of the disclosure.
Figure 8A:
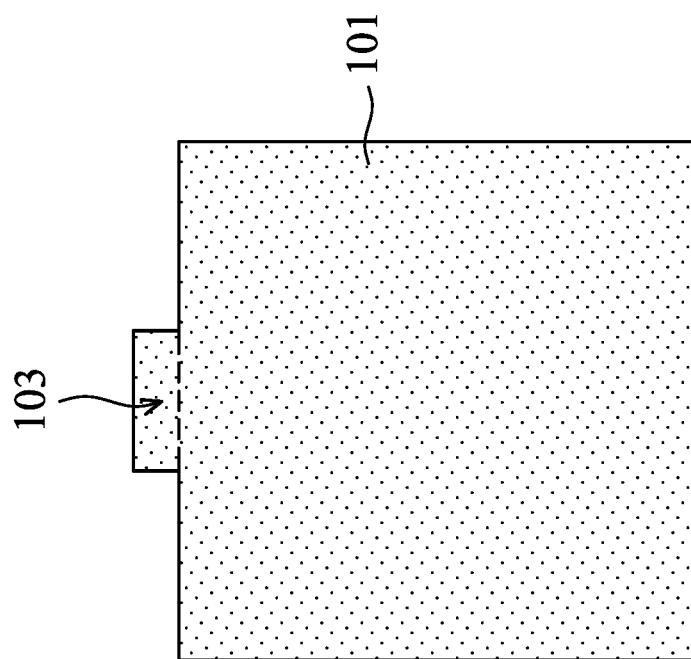

A first semiconductor layer 101 is provided, as shown in FIG. 8A in accordance with some embodiments. Some materials used to form the first semiconductor layer 101 of FIG. 8A may be similar to, or the same as, those used to form the first semiconductor layer 101 of FIG. 1A described previously and are not repeated herein. It should be noted that, the first semiconductor layer 101 includes a protruding portion 103, which may be formed by a procedure including photolithography patterning and etching processes. The details of the photolithography patterning and etching processes may be similar to, or the same as, those described previously and are not repeated herein.

Afterwards, openings 102, 106 and 108 are formed in the first semiconductor layer 101, as shown in FIG. 8B in accordance with some embodiments. Some processes used to form the openings 102, 106 and 108 may be similar to, or the same as, those used to form the opening 102 of FIG. 1A described previously and are not repeated herein. It should be noted that the openings 106 and 108 are formed at two opposite sides of the protruding portion 103.

Figure 8C:
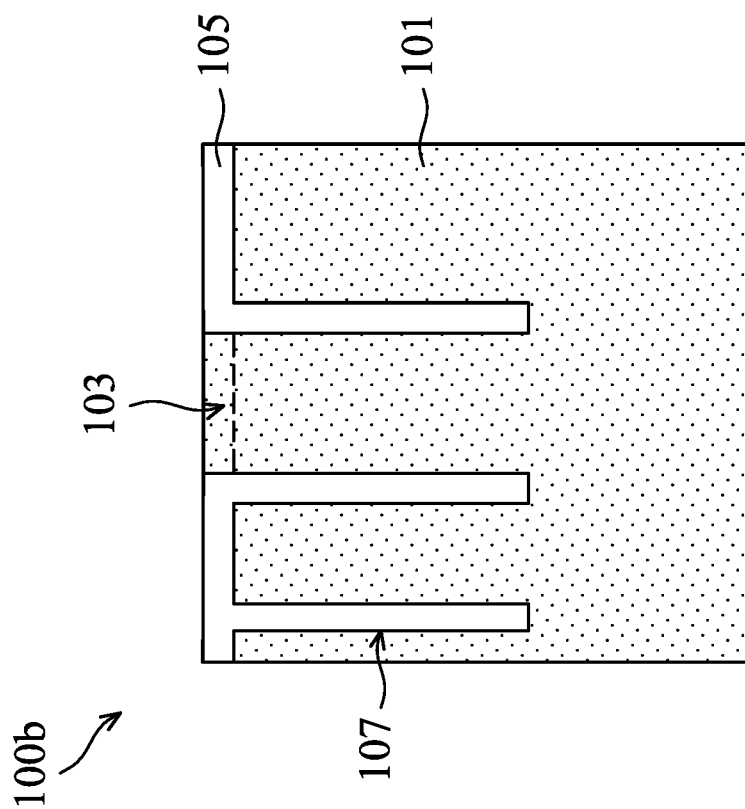

After the openings 102, 106 and 108 are formed, a dielectric layer 105 is formed over a surface of the first semiconductor layer 101, as shown in FIG. 8C in accordance with some embodiments. Moreover, the opening 102 is filled by the dielectric layer 105 such that a first alignment mark 107 is formed in the first semiconductor layer 101, which is configured to provide an alignment function in the subsequent processes. In addition, the openings 106 and 108 are filled by the dielectric layer 105. Some processes and materials used to form the dielectric layer 105 of FIG. 8C may be similar to, or the same as, those used to form the dielectric layer 105 of FIG. 1B described previously and are not repeated herein.

Figure 8D:
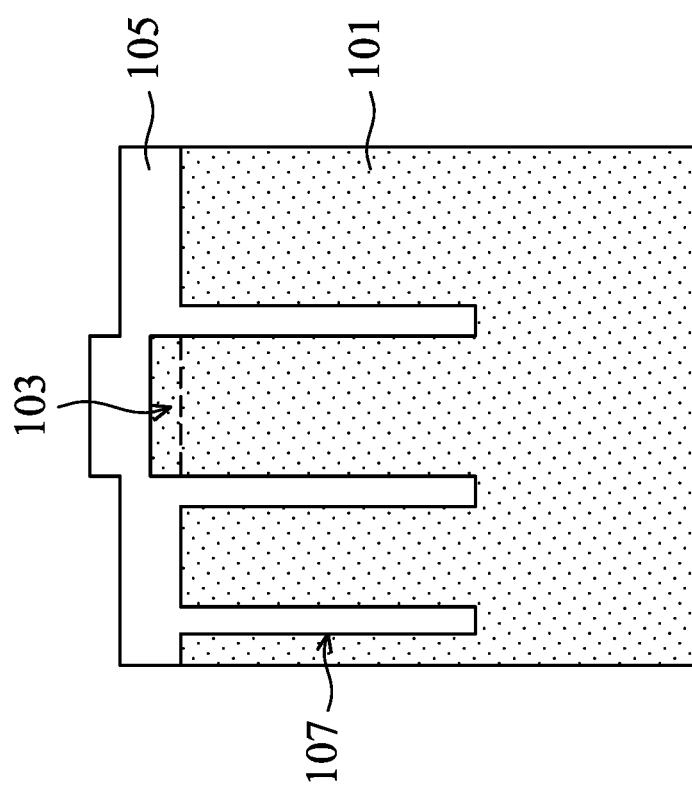

Then, a planarizing process is performed on the first semiconductor layer 101 to expose the protruding portion 103, as shown in FIG. 8D in accordance with some embodiments. In some embodiments, the planarizing process includes a grinding process, a chemical mechanical polishing (CMP) process, an etching process, another applicable process, or a combination thereof. After performing the planarizing process, the modified first portion 100b of a reflector may be obtained.

Figure 8E:
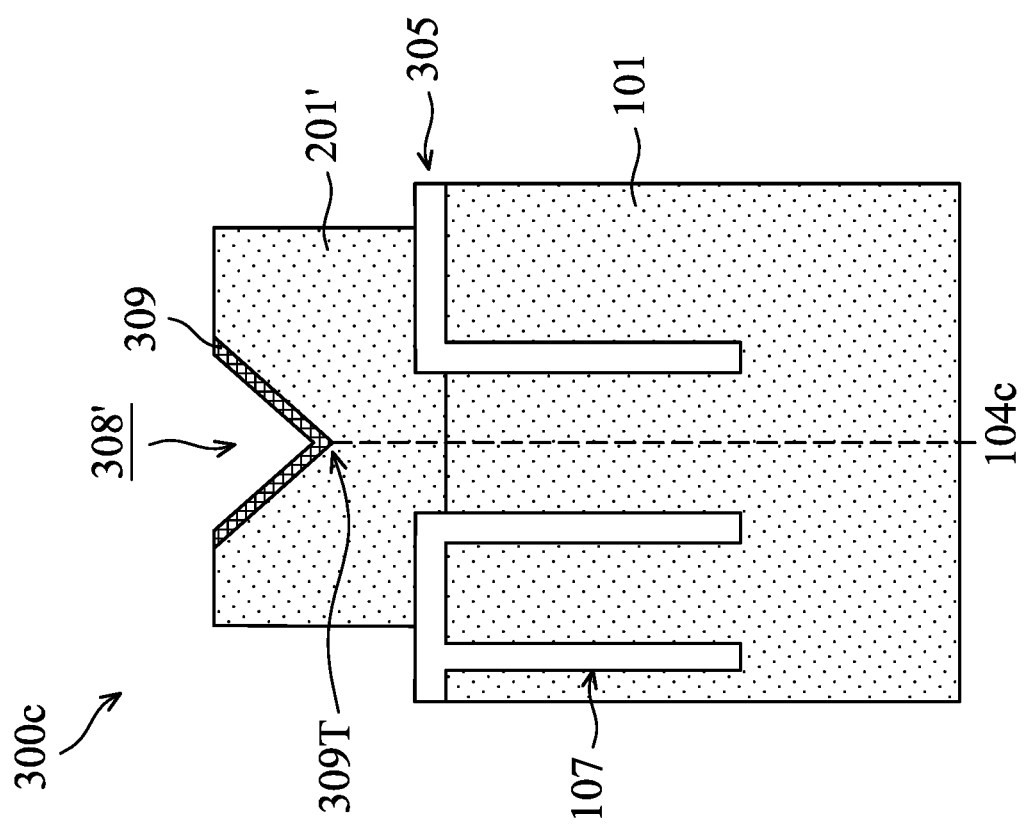
FIG. 8E is a cross-sectional representation of a modified reflector, in accordance with some embodiments of the disclosure.

FIG. 8E is a cross-sectional representation of a modified reflector 300c, in accordance with some embodiments of the disclosure. The modified reflector 300c is formed by bonding the second portion 200 of FIG. 2D to the first portion 100b of FIG. 8D, and a procedure similar to the steps shown in FIGS. 3A-3D is performed to obtain the modified reflector 300c. The modified reflector 300c is similar to the modified reflector 300b of FIG. 5, and the difference between FIG. 8E and FIG. 5 is that the reduced opening 104' is not formed in FIG. 8E.

Figure 9:
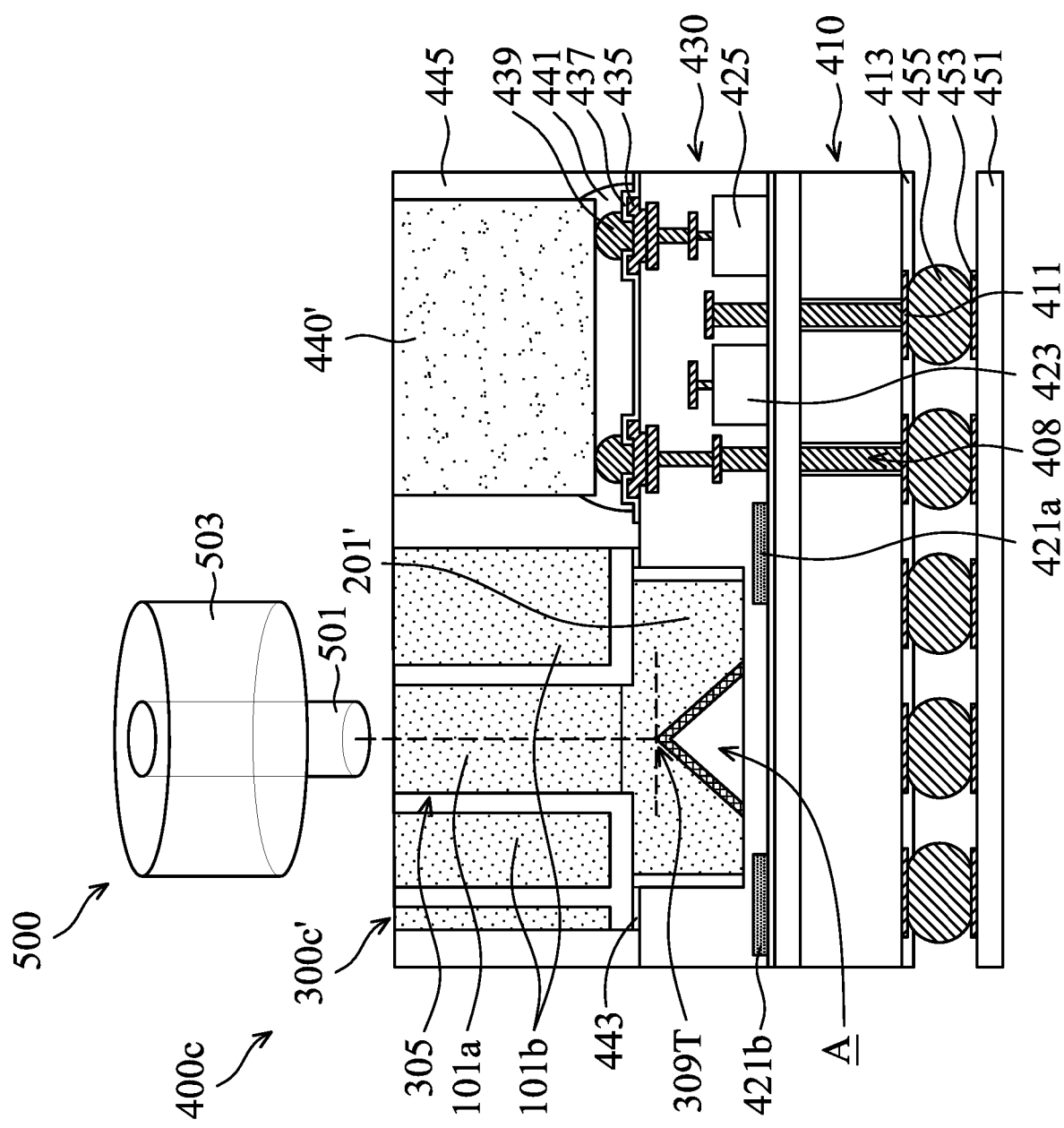
FIG. 9 shows an application of a modified package structure, in accordance with some embodiments of the disclosure.

FIG. 9 shows an application of a modified package structure 400c, in accordance with some embodiments of the disclosure. Some processes used to form the modified package structure 400c may be similar to, or the same as, those used to form the package structure 400a and are not repeated herein.

In addition, the difference between FIG. 9 and FIG. 6 is that the planarized reflector 300b' is replaced by the planarized reflector 300c' in FIG. 9. The planarized reflector 300c' is formed by the modified reflector 300c shown in FIG. 8E.

The first semiconductor layer 101 of the planarized reflector 300c' may be divided into an inner portion 101a and an outer portion 101b, which may be separated by a portion of the combined dielectric layer 305. In some embodiments, the core region 501 of the optical fiber 500 is connected to the inner portion 101a by a self-aligned process, and optical paths between the optical fiber 500 and the waveguides 421a and 421b are formed.

More specifically, optical signals may be emitted from the optical fiber 500, transmitted through the inner portion 101a, reflected by the tip 309T of the metal layer 309, transmitted by the patterned second semiconductor layer 201' and the waveguide 421a/421b, and then, received by the optical component 423. Alternatively, optical signals may be emitted from the optical component 423, transmitted by the waveguide 421a/421b and the patterned second semiconductor layer 201', reflected by the tip 309T of the metal layer 309, transmitted by the inner portion 101a, and then, received by the optical fiber 500.

In some embodiments, the inner portion 101a and the patterned second semiconductor layer 201' are transparent. Therefore, optical signals may be transmitted through the inner portion 101a and the patterned second semiconductor layer 201'.

Figure 10:
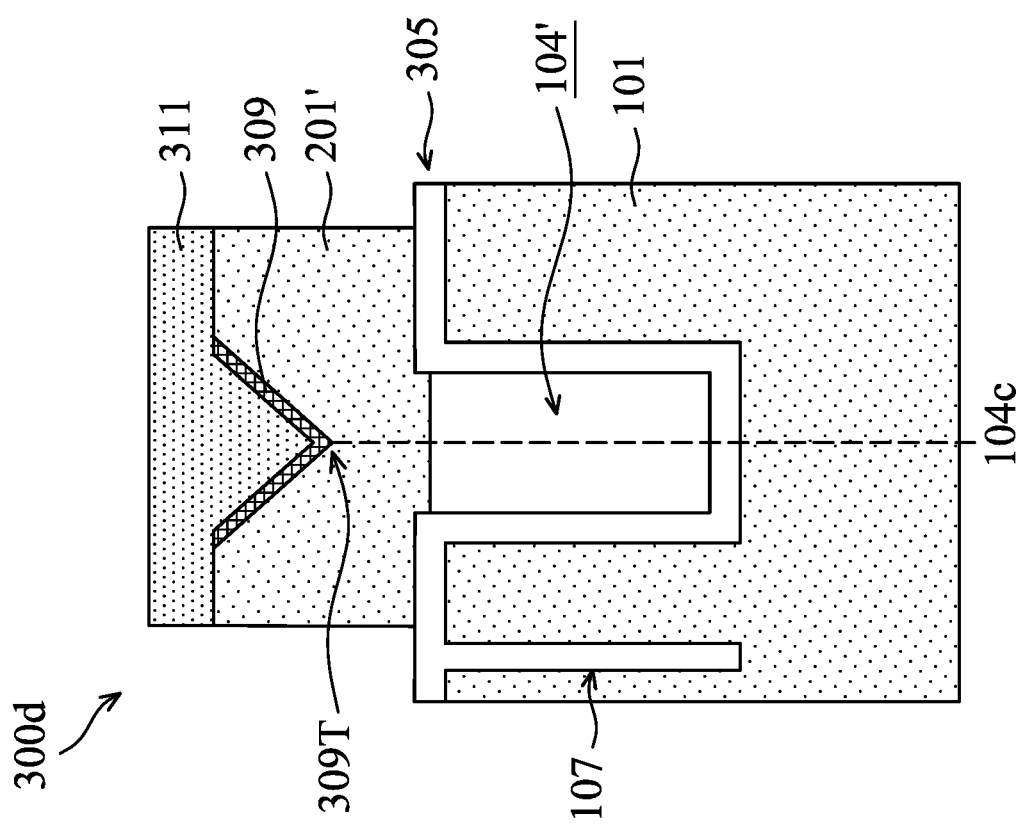
FIG. 10 is a cross-sectional representation of a modified reflector, in accordance with some embodiments of the disclosure.

FIG. 10 is a cross-sectional representation of a modified reflector 300d, in accordance with some embodiments of the disclosure. The modified reflector 300d is similar to the modified reflector 300b of FIG. 5, and the difference between FIG. 10 and FIG. 5 is that a polymer layer 311 is formed in FIG. 10.

It should be noted that, the polymer layer 311 may be formed over the patterned second semiconductor layer 201', the reduced opening 308' of FIG. 5 may be entirely filled by the polymer layer 311, and the metal layer 309 may be sandwiched between the patterned second semiconductor layer 201' and the polymer layer 311. In some embodiments, the polymer layer 311 has a portion protruding toward the patterned second semiconductor layer 201', and the protruding portion has a triangular cross-section. In some embodiments, the protruding portion is a triangular prism or a square pyramid in perspective representations, as shown in FIGS. 7A and 7B in accordance with some embodiments.

In some embodiments, the polymer layer 311 is formed by a procedure including dispensing, photolithography patterning and etching processes. In some embodiments, the polymer layer 311 is made of polybenzoxazole (PBO), liquid epoxy, deformable gel, silicon rubber, epoxy-based resin, another applicable polymer material, or a combination thereof.

Figure 11:
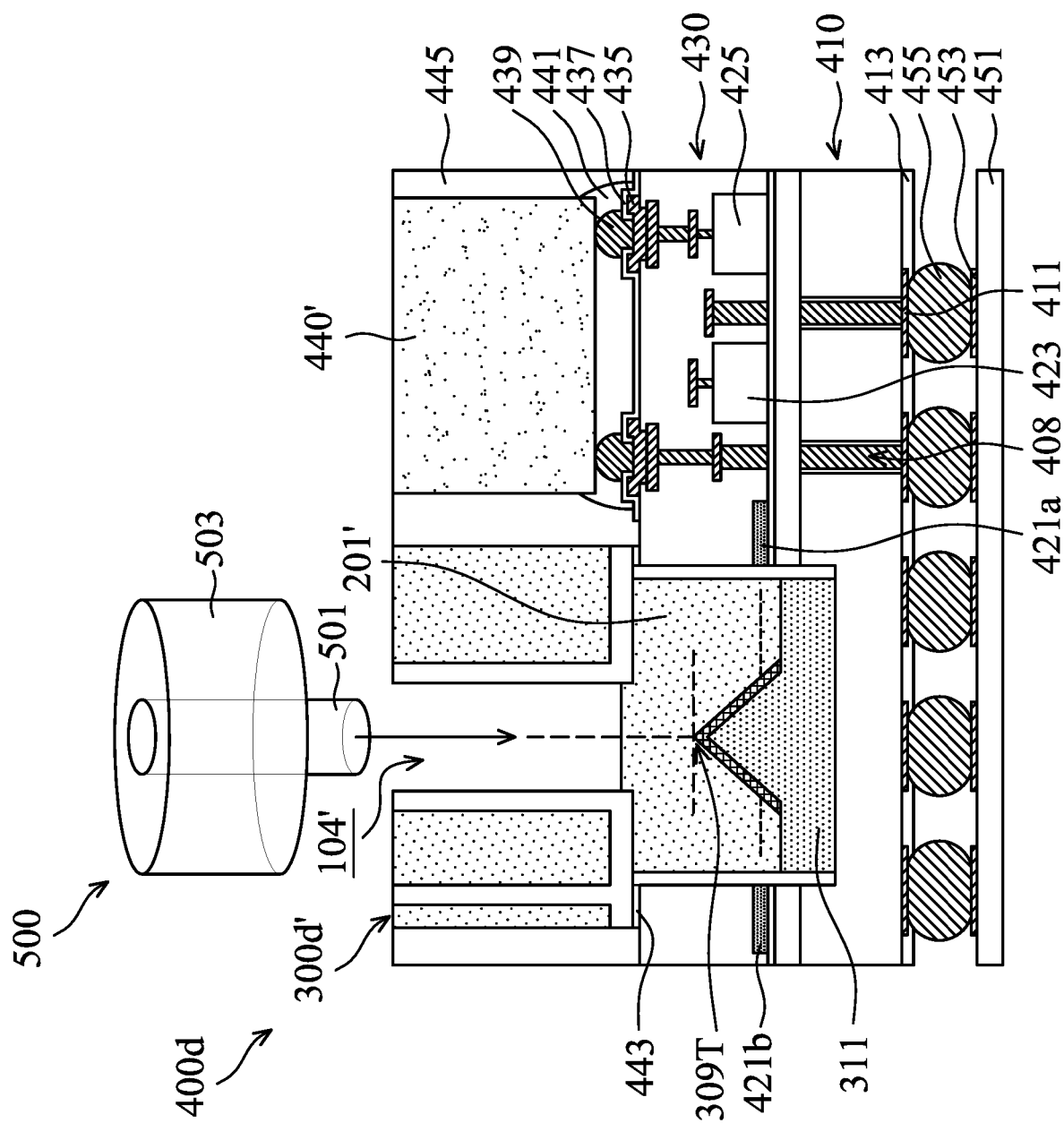
FIG. 11 shows an application of a modified package structure, in accordance with some embodiments of the disclosure.

FIG. 11 shows an application of a modified package structure 400d, in accordance with some embodiments of the disclosure. Some processes used to form the modified package structure 400d may be similar to, or the same as, those used to form the package structure 400a described previously and are not repeated herein.

In addition, the difference between FIG. 11 and FIG. 6 is that the opening 432 (shown in FIG. 4A, not shown in FIG. 11) for bonding the reflector 300d is formed deeper, and the planarized reflector 300b' is replaced by the planarized reflector 300d' in FIG. 11. The planarized reflector 300d' is formed by the modified reflector 300d shown in FIG. 10.

More specifically, the opening 432 for the reflector 300d is formed deeper such that the interconnect structure 430 is penetrated by the opening 432, and a portion of the package component 410 is removed. As a result, the bottom surface of the planarized reflector 300d' (i.e. the bottom surface of the polymer layer 311) is lower than the top surface of the package component 410.

In some embodiments, the polymer layer 311 is configured to be a buffer layer between the planarized reflector 300d' and the package component 410, so that damage to the elements in the package component 410 may be prevented. In addition, the metal layer 309 of FIG. 11 is located lower than the metal layer 309 of FIG. 6, in accordance with some embodiments, thereby ensuring that optical signals can transmit through the waveguides 421a and 421b.

Figure 12:
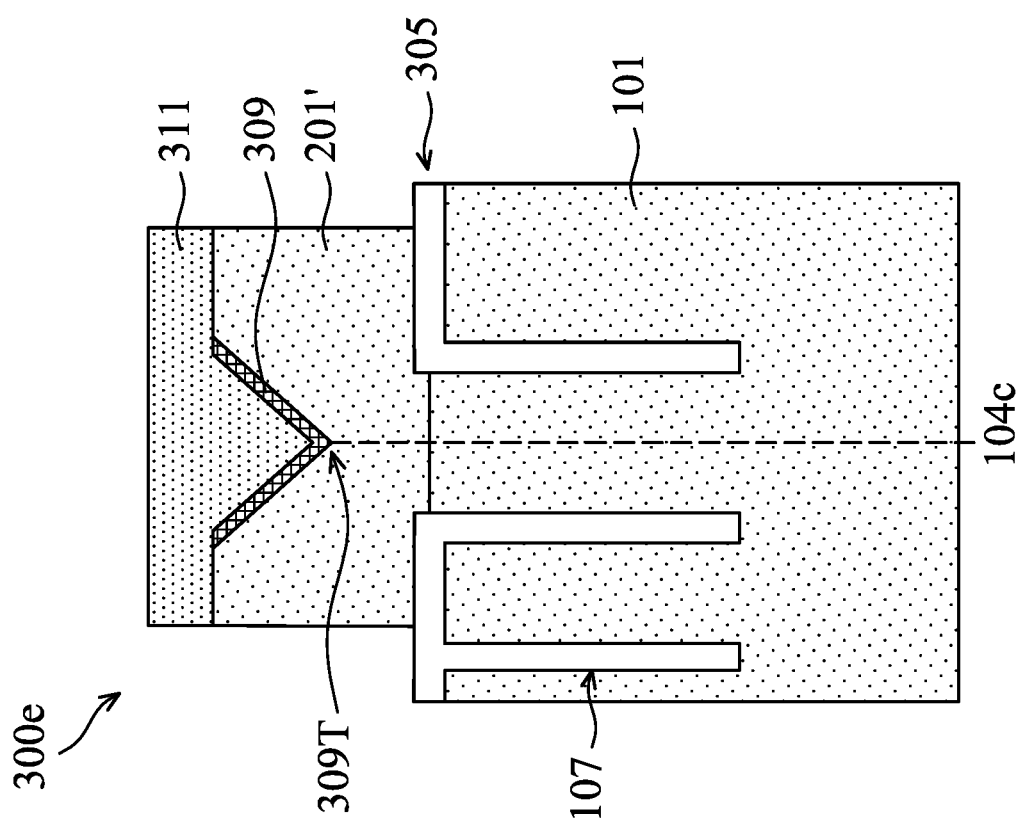
FIG. 12 is a cross-sectional representation of a modified reflector, in accordance with some embodiments of the disclosure.

FIG. 12 is a cross-sectional representation of a modified reflector 300e, in accordance with some embodiments of the disclosure. The modified reflector 300e is similar to the modified reflector 300c of FIG. 8E, and the difference between FIG. 12 and FIG. 8E is that a polymer layer 311 is formed in FIG. 12. Some materials used to form the polymer layer 311 of FIG. 12 may be similar to, or the same as, those used to form the polymer layer 311 of FIG. 10 described previously and are not repeated herein.

Figure 13:
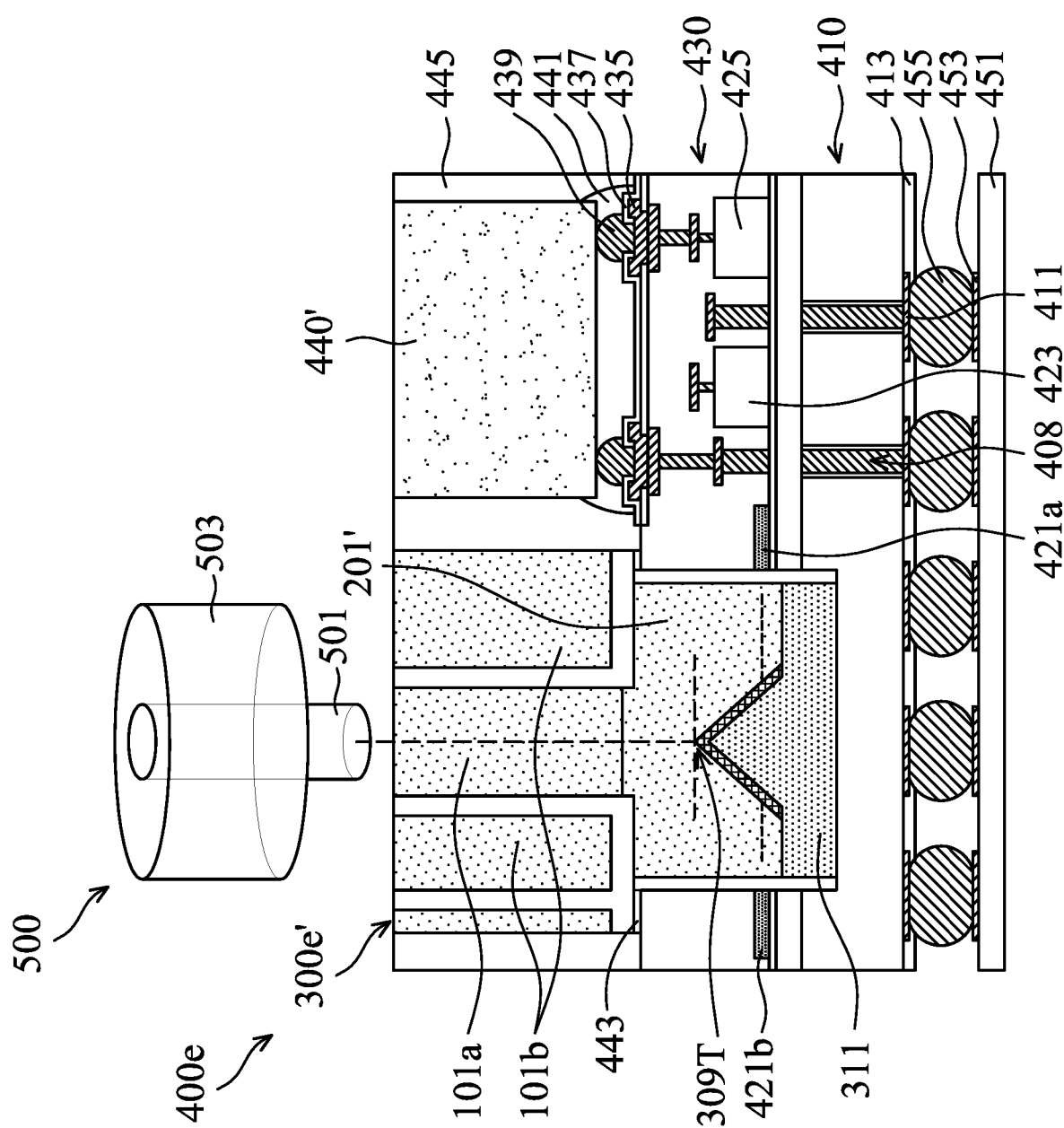
FIG. 13 shows an application of a modified package structure, in accordance with some embodiments of the disclosure.

FIG. 13 shows an application of a modified package structure 400e, in accordance with some embodiments of the disclosure. Some processes used to form the modified package structure 400e may be similar to, or the same as, those used to form the package structure 400a described previously and are not repeated herein.

In addition, the difference between FIG. 13 and FIG. 9 is that the opening 432 (shown in FIG. 4A, not shown in FIG. 13) for bonding the reflector 300e is formed deeper, and the planarized reflector 300c' is replaced by the planarized reflector 300e' in FIG. 13. The planarized reflector 300e' is formed by the modified reflector 300e shown in FIG. 12.

In some embodiments, the polymer layer 311 is configured to be a buffer layer between the planarized reflector 300e' and the package component 410, so that damage to the elements in the package component 410 may be prevented. In addition, the metal layer 309 of FIG. 13 is located lower than the metal layer 309 of FIG. 9, in accordance with some embodiments, thereby ensuring that optical signals can transmit through the waveguides 421a and 421b.

Embodiments of the package structures 400a, 400b, 400c, 400d and 400e include the planarized reflectors 300a', 300b', 300c', 300d' and 300e', which allow the optical fiber 500 to be connected to the package structures 400a-400e by a self-aligned process, and optical paths may be formed between the optical fiber 500 and the waveguides 421a and 421b. Moreover, since each of the planarized reflectors 300a'-300e' has a metal layer 309 with an inversed V-shaped cross-section, optical signals may be efficiently reflected by the tilted sidewalls 309s and 309s' of the inversed V-shaped cross-section. As a result, the optical paths may not be limited by the components in the package structures 400a-400e, the space in the package structures 400a-400e may be effectively utilized, and the overall sizes of the package structures 400a-400e may be reduced. Furthermore, optical signals may be split up to four beams, which is advantageous for high bandwidth applications. In addition, by integrating the planarized reflectors 300a'-300e' into the package structures 400a-400e, optical signals may be easily and efficiently transmitted between two regions having a large size difference. As a result, the size of the package structures 400a-400e may be minimized, which allow more components to be integrated into a given area in the package structures 400a-400e.

In some embodiments, a method for forming a package structure is provided. The method includes disposing an optical component and a waveguide over a substrate, forming a passivation layer over the substrate and covering the optical component and the waveguide, and forming a reflector comprising a metal layer and a first semiconductor layer on the passivation layer, wherein the metal layer and the first semiconductor layer are in contact with the passivation layer. In some embodiments, the waveguide is disposed between the metal layer and the optical component. In some embodiments, the reflector further includes a second semiconductor layer and a dielectric layer, the second semiconductor layer comprises an inner portion and an outer portion separate from the dielectric layer. In some embodiments, the inner portion of the second semiconductor layer overlaps the metal layer. In some embodiments, the inner portion is transparent.

In some embodiments, a method for forming a package structure is provided. The method includes disposing an optical component and a waveguide over a substrate, forming a passivation layer over the substrate and covering the optical component and the waveguide, forming a reflector comprising a metal layer and a first semiconductor layer, removing a portion of the first semiconductor layer to form a first opening, and bonding the reflector to the passivation layer, wherein the first opening overlaps the metal layer. In some embodiments, the metal layer has a triangular shape, and a tip of the metal layer is shifted from a central axis of the first opening. In some embodiments, the reflector further includes a second semiconductor layer disposed between the first semiconductor layer and the metal layer, the step of forming the passivation layer further includes forming a second opening on the passivation layer, and the second semiconductor layer is disposed in the second opening. In some embodiments, the second opening is wider than the first opening. In some embodiments, a portion of the waveguide overlaps the second opening. In some embodiments, a tip of the metal layer is aligned with a central axis of the first opening. In some embodiments, the method further includes performing a planarization process to the first semiconductor layer of the reflector to expose the first opening from the first semiconductor layer. In some embodiments, the method further includes forming a chip on the passivation layer, wherein the step of performing the planarization process comprises removing a portion of the chip, such that a top surface of the chip and a top surface of the first semiconductor layer are coplanar. In some embodiments, the method further includes comprising forming a polymer layer to cover the metal layer and the first semiconductor layer.

In some embodiments, a method for forming a package structure is provided. The method includes forming a first dielectric layer on a first semiconductor layer, forming a second dielectric layer on a second semiconductor layer, bonding the first dielectric layer and the second dielectric layer to form a combined dielectric layer, removing a portion of the first semiconductor layer, disposing a metal layer on the first semiconductor layer to form a reflector, and connecting the reflector to a package component through an interconnect structure. In some embodiments, the step of forming the second dielectric layer on the second semiconductor layer includes forming a first opening and a second opening on the second semiconductor layer, and completely filling the first opening by the second dielectric layer, and partially filling the second opening by the second dielectric layer to obtain a reduced second opening, wherein the second opening is wider than the first opening. In some embodiments, the first semiconductor layer includes a protruding portion, and the reduced second opening is covered by the protruding portion after the step of bonding the first dielectric layer and the second dielectric layer. In some embodiments, the method further includes removing a portion of the second dielectric layer to expose the protruding portion before the step of bonding the first dielectric layer and the second dielectric layer. In some embodiments, the step of forming the second dielectric layer on the second semiconductor layer includes forming a third opening in the second semiconductor layer, and the first opening aligns the third opening after the step of bonding the first dielectric layer and the second dielectric layer. In some embodiments, a width of the first semiconductor layer is equal to a width of the second semiconductor layer before the step of removing the portion of the first semiconductor layer, and the width of the first semiconductor layer is less to the width of the second semiconductor layer before the step of removing the portion of the first semiconductor 1

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
    disposing an optical component and a waveguide over a substrate;
    forming a passivation layer over the substrate and covering the optical component and the waveguide; and
    forming a reflector comprising a metal layer and a first semiconductor layer on the passivation layer, wherein the metal layer and the first semiconductor layer are in contact with the passivation layer.

2. The method for forming the package structure as claimed in claim 1, wherein the waveguide is disposed between the metal layer and the optical component.

3. The method for forming the package structure as claimed in claim 1, wherein the reflector further comprises a second semiconductor layer and a dielectric layer, the second semiconductor layer comprises an inner portion and an outer portion separate from the dielectric layer.

4. The method for forming the package structure as claimed in claim 3, wherein the inner portion of the second semiconductor layer overlaps the metal layer.

5. The method for forming the package structure as claimed in claim 3, wherein the inner portion is transparent.

6. A method for forming a package structure, comprising:
    disposing an optical component and a waveguide over a substrate;
    forming a passivation layer over the substrate and covering the optical component and the waveguide;
    forming a reflector comprising a metal layer and a first semiconductor layer;
    removing a portion of the first semiconductor layer to form a first opening; and
    bonding the reflector to the passivation layer, wherein the first opening overlaps the metal layer.

7. The method for forming the package structure as claimed in claim 6, wherein the metal layer has a triangular shape, and a tip of the metal layer is shifted from a central axis of the first opening.

8. The method for forming the package structure as claimed in claim 6, wherein the reflector further comprises a second semiconductor layer disposed between the first semiconductor layer and the metal layer, the step of forming the passivation layer further comprises forming a second opening on the passivation layer, and the second semiconductor layer is disposed in the second opening.

9. The method for forming the package structure as claimed in claim 8, wherein the second opening is wider than the first opening.

10. The method for forming the package structure as claimed in claim 8, wherein a portion of the waveguide overlaps the second opening.

11. The method for forming the package structure as claimed in claim 6, wherein a tip of the metal layer is aligned with a central axis of the first opening.

12. The method for forming the package structure as claimed in claim 6, further comprising performing a planarization process to the first semiconductor layer of the reflector to expose the first opening from the first semiconductor layer.

13. The method for forming the package structure as claimed in claim 12, further comprising forming a chip on the passivation layer, wherein the step of performing the planarization process comprises removing a portion of the chip, such that a top surface of the chip and a top surface of the first semiconductor layer are coplanar.

14. The method for forming the package structure as claimed in claim 6, further comprising forming a polymer layer to cover the metal layer and the first semiconductor layer.

15. A method for forming a package structure, comprising:
    forming a first dielectric layer on a first semiconductor layer;
    forming a second dielectric layer on a second semiconductor layer;
    bonding the first dielectric layer and the second dielectric layer to form a combined dielectric layer;
    removing a portion of the first semiconductor layer;
    disposing a metal layer on the first semiconductor layer to form a reflector; and
    connecting the reflector to a package component through an interconnect structure.

16. The method for forming the package structure as claimed in claim 15, wherein the step of forming the second dielectric layer on the second semiconductor layer comprises:
    forming a first opening and a second opening on the second semiconductor layer, wherein the second opening is wider than the first opening; and
    completely filling the first opening by the second dielectric layer, and partially filling the second opening by the second dielectric layer to obtain a reduced second opening.

17. The method for forming the package structure as claimed in claim 16, wherein the first semiconductor layer comprises a protruding portion, and the reduced second opening is covered by the protruding portion after the step of bonding the first dielectric layer and the second dielectric layer.

18. The method for forming the package structure as claimed in claim 17, further comprising removing a portion of the second dielectric layer to expose the protruding portion before the step of bonding the first dielectric layer and the second dielectric layer.

19. The method for forming the package structure as claimed in claim 16, wherein the step of forming the second dielectric layer on the second semiconductor layer comprises forming a third opening in the second semiconductor layer, and the first opening aligns the third opening after the step of bonding the first dielectric layer and the second dielectric layer.

20. The method for forming the package structure as claimed in claim 15, wherein a width of the first semiconductor layer is equal to a width of the second semiconductor layer before the step of removing the portion of the first semiconductor layer, and the width of the first semiconductor layer is less to the width of the second semiconductor layer before the step of removing the portion of the first semiconductor layer.

* * * * *